(12) United States Patent
Yoon et al.

(10) Patent No.: US 11,251,337 B2
(45) Date of Patent: Feb. 15, 2022

(54) DISPLAY APPARATUS

(71) Applicant: Seoul National University R&DB Foundation, Seoul (KR)

(72) Inventors: Euijoon Yoon, Seoul (KR); Jehong Oh, Seoul (KR); Jung El Ryu, Seoul (KR); Seungmin Lee, Seoul (KR); Jongmyeong Kim, Anyang-si (KR)

(73) Assignee: Seoul National University R&DB Foundation

( * ) Notice: Subject to any disclaimer, the term of this patent is extended or adjusted under 35 U.S.C. 154(b) by 112 days.

(21) Appl. No.: 16/681,804

(22) Filed: Nov. 12, 2019

(65) Prior Publication Data

US 2020/0152832 A1    May 14, 2020

(30) Foreign Application Priority Data

Nov. 14, 2018  (KR) .......................... 10-2018-0140244

(51) Int. Cl.
*H01L 33/20* (2010.01)
*H01L 25/075* (2006.01)
*H01L 33/36* (2010.01)
*H01L 33/62* (2010.01)

(52) U.S. Cl.
CPC .......... *H01L 33/20* (2013.01); *H01L 25/0753* (2013.01); *H01L 33/36* (2013.01); *H01L 33/62* (2013.01)

(58) Field of Classification Search
None
See application file for complete search history.

(56) References Cited

U.S. PATENT DOCUMENTS

| 2014/0167077 | A1* | 6/2014 | Chen ....................... H01L 33/20 |
| | | | 257/88 |
| 2014/0267683 | A1* | 9/2014 | Bibl ....................... H01L 27/156 |
| | | | 348/87 |
| 2014/0367705 | A1* | 12/2014 | Bibl .................... H01L 33/0008 |
| | | | 257/88 |
| 2016/0372514 | A1* | 12/2016 | Chang .................. G09G 3/2003 |
| 2017/0186907 | A1* | 6/2017 | Chaji .................... H01L 27/153 |
| 2017/0309678 | A1* | 10/2017 | Yang ........................ H01L 33/44 |
| 2017/0337870 | A1* | 11/2017 | Lin ........................... G09G 3/32 |
| 2018/0019426 | A1 | 1/2018 | Im et al. |
| 2019/0288156 | A1* | 9/2019 | Chaji ................. H01L 33/0037 |

* cited by examiner

*Primary Examiner* — Bilkis Jahan
(74) *Attorney, Agent, or Firm* — Renaissance IP Law Group LLP

(57) ABSTRACT

The present disclosure relates to a display device, and more particularly, to a display device including a plurality of pixels on a base layer and a first light-emitting element and a second light-emitting element, which are provided on a first pixel of the pixels. Here, each of the first and second light-emitting elements includes a first surface and a second surface opposite to the first surface, the first surface of the first light-emitting element faces the base layer, and the second surface of the second light-emitting element faces the base layer.

19 Claims, 28 Drawing Sheets

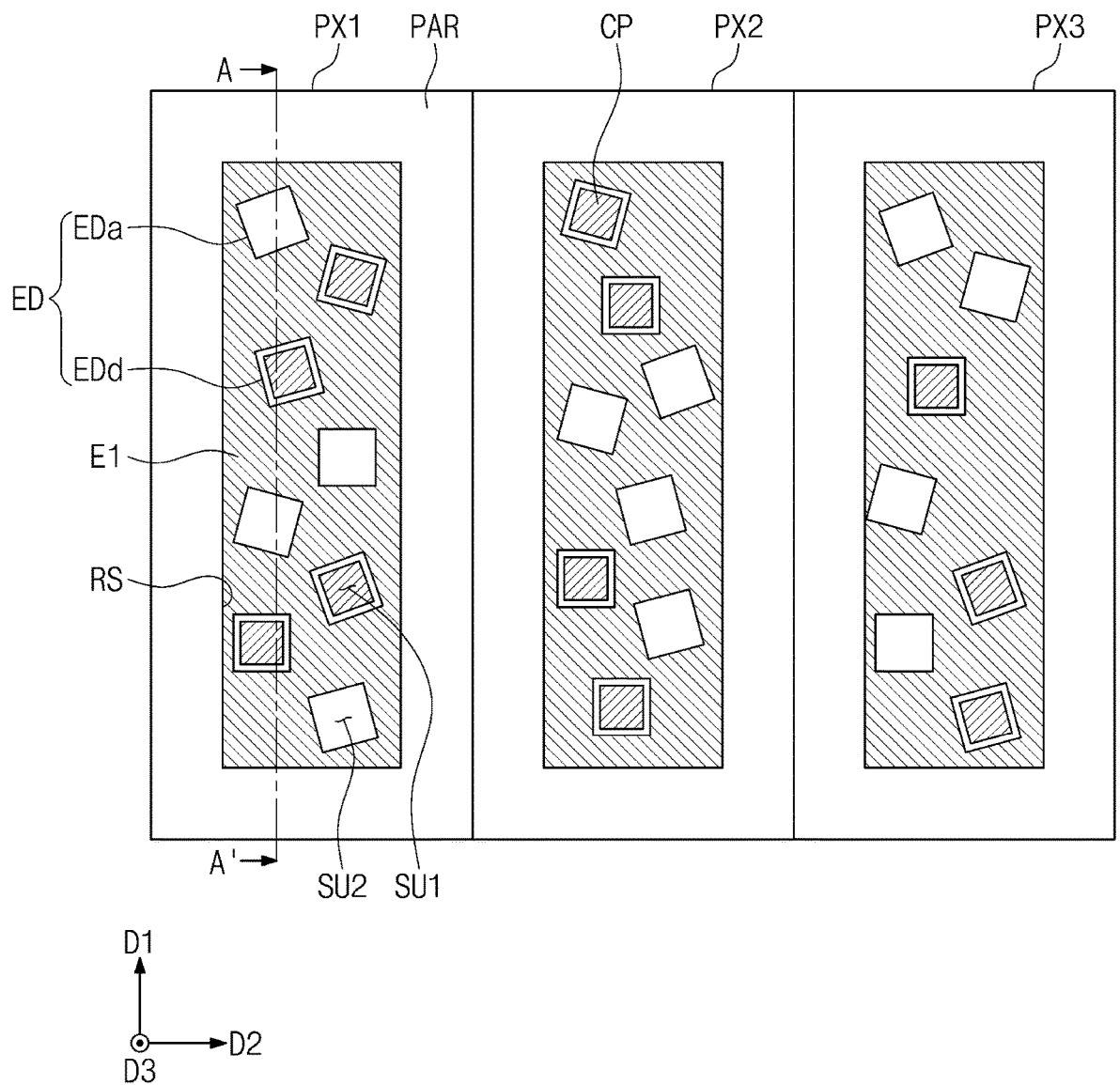

DISPLAY APPARATUS

CROSS-REFERENCE TO RELATED APPLICATIONS

This U.S. non-provisional patent application claims priority under 35 U.S.C. § 119 of Korean Patent Application No. 10-2018-0140244, filed on Nov. 14, 2018, the entire contents of which are hereby incorporated by reference.

BACKGROUND

The present disclosure herein relates to a display device and a method for manufacturing the same.

A display device may include a light-emitting element. The light-emitting element may be electrically connected to an electrode and emit light according to a voltage applied to the electrode. The light-emitting element may be directly provided on the electrode, or the light-emitting element may be separately manufactured and then disposed on the electrode.

The light-emitting element may be a light-emitting diode (LED). The LED is a semiconductor element converting energy, which is generated through recombination between a hole and an electron by applying a voltage to a PN junction diode in a forward direction, into light. The LED may be provided as an inorganic LED or an organic LED. The LED may be used for a small electronic device such as a mobile phone as well as a large-area television (TV).

SUMMARY

The present disclosure provides a display device having an improved light-emitting efficiency.

The present disclosure also provides a method for manufacturing a display device having an improved productivity.

An embodiment of the inventive concept provides a display device including: a plurality of pixels on a base layer; and a first light-emitting element and a second light-emitting element, which are provided on a first pixel of the pixels. Here, each of the first and second light-emitting elements includes a first surface and a second surface opposite to the first surface, the first surface of the first light-emitting element faces the base layer, and the second surface of the second light-emitting element faces the base layer.

An embodiment of the inventive concept, a display device includes: a plurality of pixels on a base layer; a plurality of light-emitting elements provided on a first pixel of the pixels. Here, the plurality of light-emitting elements include a first light-emitting element, a second light-emitting element, a third light-emitting element, and fourth light-emitting element, the second, third and fourth light-emitting elements are adjacent to the first light-emitting element. Here, when viewed in plan-view, a first virtual line configured to connect a center of the first light-emitting element and a center of the second light-emitting element is defined, and a second virtual line configured to connect the center of the first light-emitting element and a center of the third light-emitting element is defined, and a third virtual line configured to connect the center of the first light-emitting element and a center of the fourth light-emitting element is defined. The first to third virtual lines have different lengths from each other, and an angle between the first virtual line and the second virtual line is different from that between the second virtual line and the third virtual line.

An embodiment of the inventive concept, a display device includes: a plurality of pixels arranged in a first direction on a base layer; and first and second light-emitting elements provided on a first pixel of the pixels. Here, when viewed in plan-view, a first center line passing a center of the first light-emitting element and perpendicular to both sidewalls of the first light-emitting element is defined, a second center line passing a center of the second light-emitting element and perpendicular to both sidewalls of the second light-emitting element is defined, the first center line and the first direction have a first angle, and the second center line and the first direction have a second angle different from the first angle.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 3 is a plan-view illustrating pixels of the display device according to embodiments of the inventive concept;

DETAILED DESCRIPTION

Figure 1:
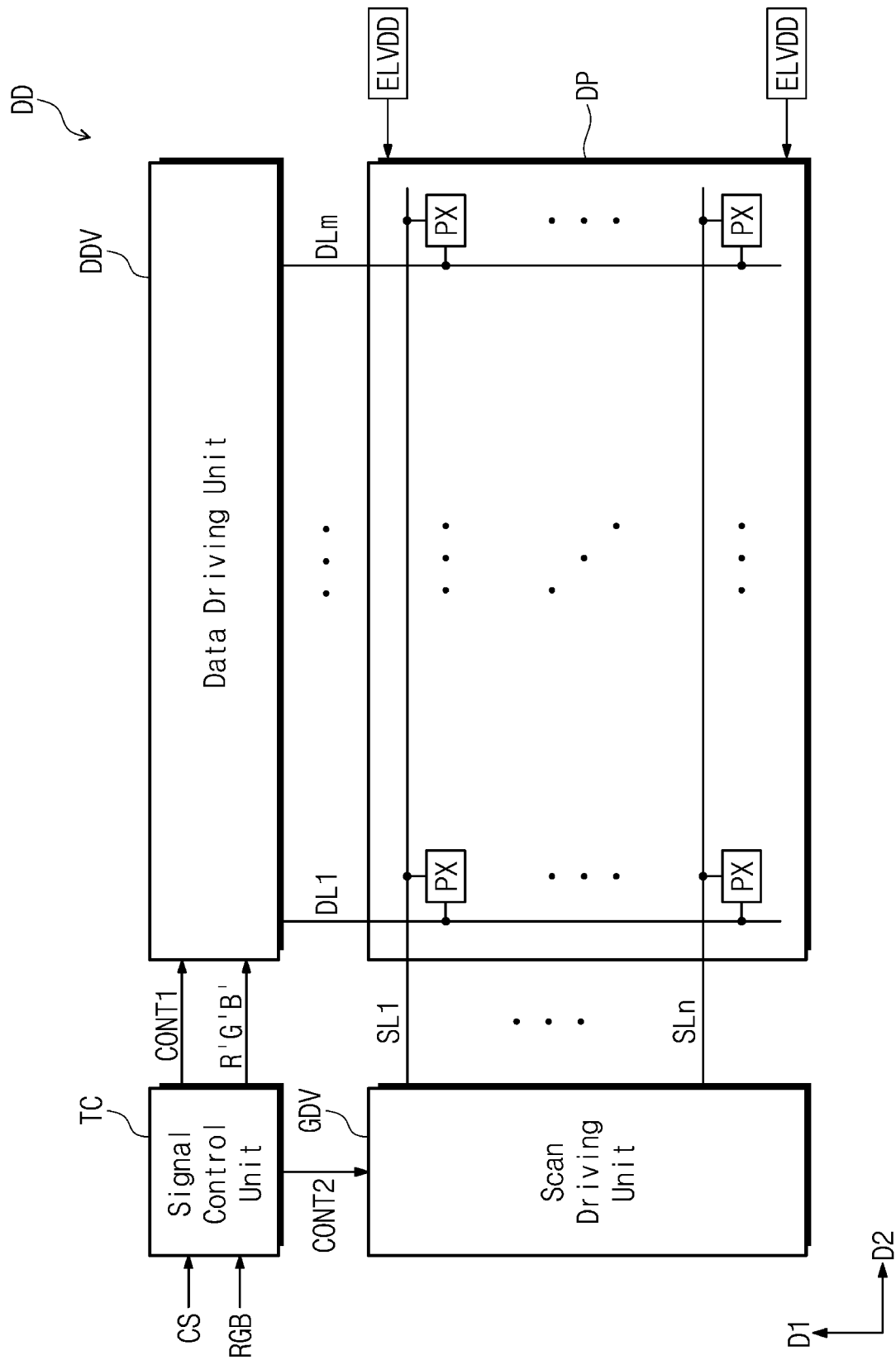
FIG. 1 is a block diagram representing a display device according to embodiments of the inventive concept.

Exemplary embodiments of the present invention will be described with reference to the accompanying drawings so as to sufficiently understand constitutions and effects of the present invention. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

In this specification, it will also be understood that when another component is referred to as being 'on' one component, it can be directly on the one component, or an intervening third component may also be present. Also, in the figures, the dimensions of components are exaggerated for clarity of illustration. The identical reference numerals refer to the identical elements throughout.

The embodiment in the detailed description will be described with cross-section views and/or plan-views as ideal exemplary views of the present invention. Also, in the figures, the dimensions of layers and regions are exaggerated for clarity of illustration. Areas exemplified in the drawings have general properties, and are used to illustrate a specific shape of a semiconductor package region. Thus, this should not be construed as limited to the scope of the present invention. Also, though terms like a first, a second, and a third are used to describe various regions and layers in various embodiments of the inventive concept, the regions and the layers are not limited to these terms. These terms are only used to distinguish one component from another component. An embodiment described and exemplified herein includes a complementary embodiment thereof.

In the following description, the technical terms are used only for explaining a specific exemplary embodiment while not limiting the present disclosure. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

FIG. 1 is a block diagram representing a display device according to embodiments of the inventive concept.

Referring to FIG. 1, a display device DD may include a display panel DP, a signal control unit TC (or a timing controller), a data driving unit DDV, and a scan driving unit GDV. Each of the signal control unit TC, the data driving unit DDV, and the scan driving unit GDV may include a circuit.

The display panel DP may include a light-emitting element. For example, the display panel DP may include a micro-LED. The display panel DP may include a plurality of data lines DL1 to DLm, a plurality of scan lines SL1 to SLn, and a plurality of pixels PX.

The plurality of data lines DL1 to DLm may each extend in a first direction D1. The plurality of data lines DL1 to DLm may be arranged in a second direction D2 crossing the first direction D1. The plurality of scan lines SL1 to SLn may each extend in the second direction D2. The plurality of scan lines SL1 to SLn may be arranged in the first direction D1.

Each of the pixels PX may include a light-emitting element and a pixel circuit electrically connected to the light-emitting element. The pixel circuit may include a plurality of transistors. A first voltage ELVDD and a second voltage ELVSS may be provided to each of the pixels PX.

The pixels PX may be arranged on a plane of the display panel DP according to a predetermined rule. Each of the pixels PX may display one or a mixed color of primary colors. The primary colors may include red, green, and blue. The mixed color may include yellow, cyan, magenta, and white. However, the embodiment of the inventive concept is not limited to the colors displayed by the pixels PX.

The signal control unit TC may receive image data RGB provided from the outside. The signal control unit TC may convert the image data RGB in correspondence to an operation of the display panel DP and generate converted image data R'G'B', and output the converted image data R'G'B' to the data driving unit DDV.

The signal control unit TC may receive a control signal CS provided from the outside. The control signal CS may include a vertical synchronization signal, a horizontal synchronization signal, a main clock signal, and a data enable signal. The signal control unit TC may provide a first control signal CONT1 to the data driving unit DDV and a second control signal CONT2 to the scan driving unit GDV. The first control signal CONT1 may be a signal for controlling the data driving unit DDV, and the second control signal CONT2 may be a signal for controlling the scan driving unit GDV.

The data driving unit DDV may drive the plurality of data lines DL1 to DLm in response to the first control signal CONT1 received from the signal control unit TC. The data driving unit DDV may be realized as an independent integrated circuit and electrically connected to one side of the display panel DP, or directly mounted on the display panel DP. Also, the data driving unit DDV may be realized as a single chip or include a plurality of chips.

The scan driving unit GDV may drive the scan lines SL1 to SLn in response to the second control signal CONT2 received from the signal control unit TC. For example, the scan driving unit GDV may be integrated in one area of the display panel DP. In this case, the scan driving unit GDV may include a plurality of thin film transistors that are manufactured through the same process as a driving circuit of each of the pixels PX, e.g., a low temperature polycrystalline silicon (LTPS) process or a low temperature polycrystalline oxide (LTPO) process. For another example, the scan driving unit GDV may be realized as an independent integrated circuit chip and electrically connected to one side of the display panel DP.

While a gate-on voltage is applied to one scan line of the scan lines SL1 to SLn, a switching transistor of each of pixels in one row connected thereto may be turned on. Here, the data driving unit DDV provides data driving signals to the data lines DL1 to DLm. The data driving signals provided to the data lines DL1 to DLm may be applied to a corresponding pixel through the turned-on switching transistor. The data driving signals may be analog voltages corresponding to gray scale values of image data.

Figure 2:
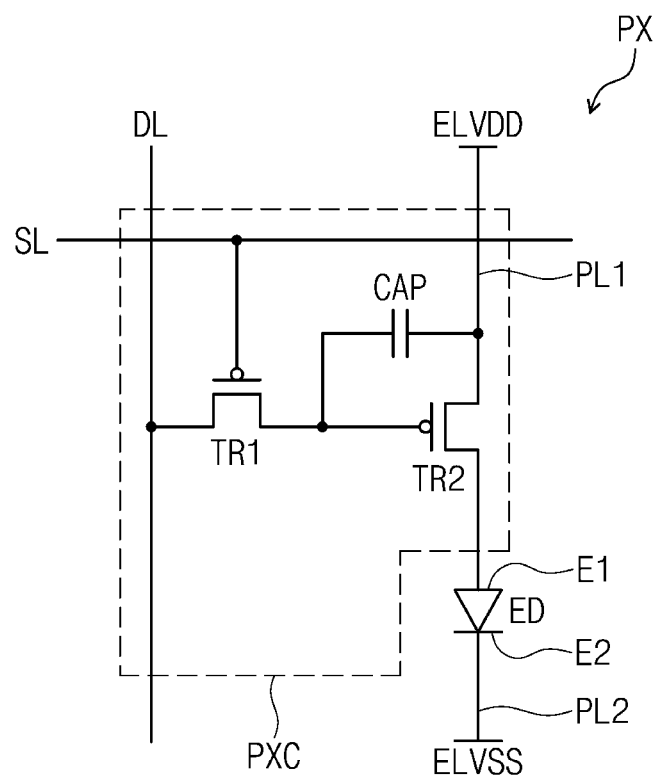
FIG. 2 is an equivalent circuit diagram illustrating a pixel according to embodiments of the inventive concept.

FIG. 2 is an equivalent circuit diagram illustrating the pixel according to embodiments of the inventive concept.

Referring to FIG. 2, the pixel PX may be connected to a plurality of signal lines. The signal lines according to the embodiment may include a scan line SL, a data line DL, a first power line PL1, and a second power line PL2.

The pixel PX may include a light-emitting element ED, a first electrode E1, a second electrode E2, and a pixel circuit PXC. The pixel circuit PXC may include a first thin-film transistor TR1, a capacitor CAP, and a second thin-film transistor TR2.

The first thin-film transistor TR1 may be a switching transistor controlling on-off of the pixel PX. The first thin-film transistor TR1 may transmit or block a data signal transmitted through the data line DL in response to a gate signal transmitted through the scan line SL.

The capacitor CAP may be connected between the first thin-film transistor TR1 and the first power line PL1. An electric charge may be charged in the capacitor CAP by a voltage difference between a data signal transmitted from the first thin-film transistor TR1 and a first power voltage ELVDD applied to the first power line PL1.

The second thin-film transistor TR2 may be connected to the first thin-film transistor TR1, the capacitor CAP, and the light emitting element ED. The second thin-film transistor TR2 controls a driving current flowing through the light-emitting element ED in correspondence to a charge amount charged in the capacitor CAP. According to the charge amount charged in the capacitor CAP, a turn-on time of the second thin-film transistor TR2 may be determined.

Each of the first thin-film transistor TR1 and the second thin-film transistor TR2 may be an n-type thin-film transistor or a p-type thin-film transistor. Also, in another embodiment of the inventive concept, at least one of the first thin-film transistor TR1 and the second thin-film transistor TR2 may be an n-type thin-film transistor, and the other may be a p-type thin-film transistor.

The light-emitting element ED may be connected between the second thin-film transistor TR2 and the second power line PL2.

For example, the light-emitting element ED may be connected to the first electrode E1 connected to the second thin-film transistor TR2 and the second electrode E2 connected to the second power line PL2. The first electrode E1 may be electrically connected to the pixel circuit PXC, and the second electrode E2 may receive a voltage, e.g., the second voltage ELVSS, through the second power line PL2. The light-emitting element ED may emit light by a voltage difference between a signal transmitted through the second thin-film transistor TR2 and the second voltage ELVSS received through the second power line PL2.

The light-emitting element ED may be a micro-LED element. The micro-LED element may be an LED element having a size of about several nanometers to several hundred micrometers. However, although the size of the micro-LED element is described as an example, the embodiment of the inventive concept is not limited to the above-described numerical range of the size of the micro-LED element.

Although one light-emitting element ED is exemplarily connected between the second thin-film transistor TR2 and the second power line PL2 in FIG. 2, the light-emitting element ED may be provided in plurality. The plurality of light-emitting elements ED may be connected in parallel to each other.

Figure 4A:
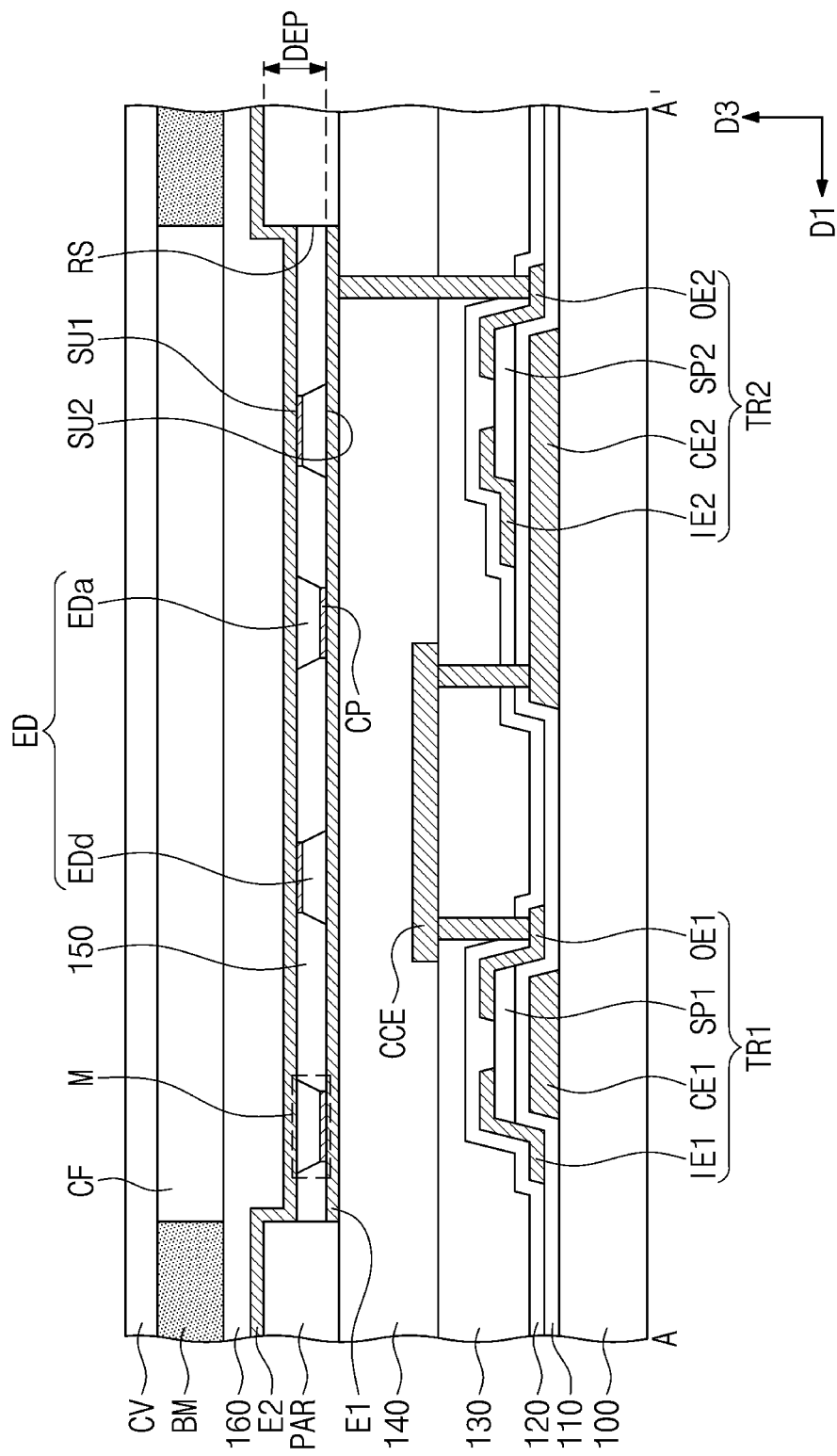
FIG. 4A is a cross-section view taken along line A-A' of FIG. 3.
Figure 4B:
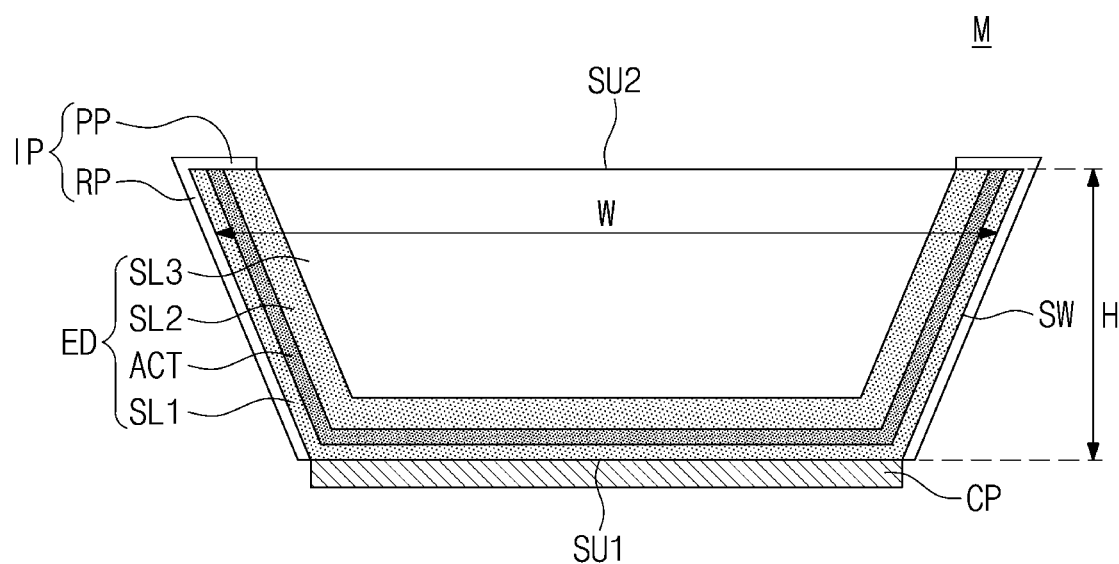
FIG. 4B is an enlarged cross-section view illustrating region M of FIG. 4A.
Figure 5:
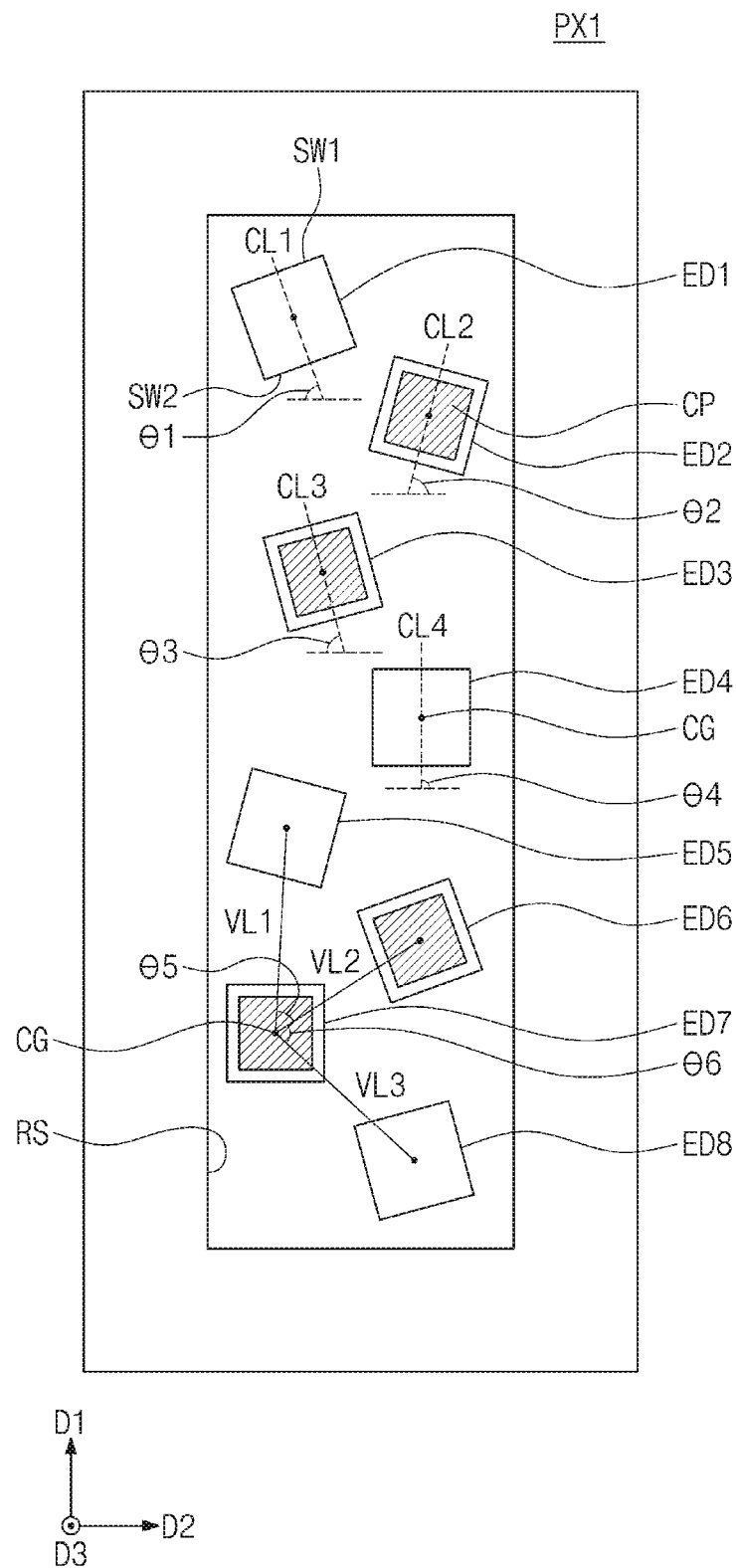
FIG. 5 is an enlarged plan-view illustrating a first pixel of FIG. 3.

FIG. 3 is a plan-view illustrating the pixels of the display device according to embodiments of the inventive concept. FIG. 4A is a cross-section view taken along line A-A' of FIG. 3. FIG. 4B is an enlarged cross-sectional view illustrating region M of FIG. 4A. FIG. 5 is an enlarged plan-view illustrating a first pixel of FIG. 3.

Referring to FIGS. 3, 4A, 4B, and 5, first to third pixels PX1 to PX3 may be provided on a base layer 100. The base layer 100 may be a stacked structure including a silicon substrate, a plastic substrate, a glass substrate, an insulation film, or a plurality of insulation layers.

The first to third pixels PX1 to PX3 may be arranged in a two-dimensional manner. For example, the first to third pixels PX1 to PX3 may be arranged in the second direction D2. Although not shown, as additional pixels are provided, the pixels may be arranged on the base layer 100 in the two-dimensional manner.

Each of the first to third pixels PX1 to PX3 may include a first thin-film transistor TR1, a second thin-film transistor TR2, and a plurality of light-emitting elements ED. Hereinafter, the first pixel PX1 of the first to third pixels PX1 to PX3 will be representatively described.

The first thin-film transistor TR1 and the second thin-film transistor TR2 may be disposed on the base layer 100. The first thin-film transistor TR1 may include a first control electrode CE1, a first input electrode IE1, a first output electrode OE1, and a first semiconductor pattern SP1. The second thin-film transistor TR2 may include a second control electrode CE2, a second input electrode IE2, a second output electrode OE2, and a second semiconductor pattern SP2.

The first control electrode CE1 and the second control electrode CE2 may be provided on the base layer 100. Each of the first control electrode CE1 and the second control electrode CE2 may contain a conductive material. A first insulation layer 110 may be provided on the base layer 100 to cover the first control electrode CE1 and the second control electrode CE2. That is, the first control electrode CE1 and the second control electrode CE2 may be disposed between the first insulation layer 110 and the base layer 100.

The first semiconductor pattern SP1 and the second semiconductor pattern SP2 may be provided on the first insulation layer 110. Each of the first and second semiconductor patterns SP1 and SP2 may contain a semiconductor material. For example, the semiconductor material may include at least one of amorphous silicon, polycrystalline silicon, monocrystalline silicon, an oxide semiconductor, and a compound semiconductor. Each of the first and second semiconductor patterns SP1 and SP2 may include a channel region through which an electron or a hole is movable and a first impurity region and a second impurity region, which are spaced apart from each other with the channel region therebetween.

The first input electrode IE1 and the first output electrode OE1 may be disposed on the first semiconductor pattern SP1. The first input electrode IE1 and the first output electrode OE1 may be connected to the first impurity region and the second impurity region of the first semiconductor pattern SP1, respectively. The second input electrode IE2 and the second output electrode OE2 may be disposed on the second semiconductor pattern SP2. The second input electrode IE2 and the second output electrode OE2 may be connected to the first impurity region and the second impurity region of the second semiconductor pattern SP2, respectively.

A second insulation layer 120 may be provided on the first insulation layer 110 to cover the first and second semiconductor patterns SP1 and SP2, the first and second input electrodes IE1 and IE2, and the first and second output electrodes OE1 and OE2. That is, the first and second semiconductor patterns SP1 and SP2, the first and second input electrodes IE1 and IE2, and the first and second output electrodes OE1 and OE2 may be disposed between the first insulation layer 110 and the second insulation layer 120.

A third insulation layer 130 may be provided on the second insulation layer 120. The third insulation layer 130 may have a flat top surface. A connection electrode CCE electrically connecting the first output electrode OE1 and the second control electrode CE2 may be disposed on the third insulation layer 130. The connection electrode CCE may include a first contact passing through the second and third insulation layers 120 and 130 and connected to the first output electrode OE1. The connection electrode CCE may include a second contact passing through the first to third insulation layers 110, 120, and 130 and connected to the second control electrode CE2.

The fourth insulation layer 140 may be provided on the third insulation layer 130 to cover the connection electrode CCE. A first electrode E1 may be provided on the fourth insulation layer 140. The first electrode E1 may include a third contact passing through the second to fourth insulation layers 120, 130, and 140 and connected to the second output electrode OE2.

A partition structure PAR may be provided on the fourth insulation layer 140. A bottom surface of the partition structure PAR and a bottom surface of the first electrode E1 may provide a coplanar surface. The partition structure PAR may define a recessed region RS exposing a top surface of the first electrode E1. In other words, the recessed region RS may be defined by an inside wall of the partition structure PAR and a top surface of the first electrode E1. The recessed region RS may have a predetermined depth DEP from a top surface of the partition structure PAR.

A plurality of light emitting elements ED may be provided on the first electrode E1 in the recessed region RS. The light-emitting elements ED may be randomly arranged on the first electrode E1 in a two-dimensional manner Each of the light-emitting elements ED may have a first surface SU1 and a second surface SU2 opposite to the first surface SU1. For example, a p-type semiconductor layer of the light-emitting element ED may be adjacent to the first surface SU1, and an n-type semiconductor layer of the light-emitting element ED may be adjacent to the second surface SU2. A conductive pattern CP may be provided on the first surface SU1 of the light-emitting element ED. The conductive pattern CP may contain metal having a low melting point (e.g., Ni, Au, and an alloy of Ni and Au, or multi-layers of Ni/Au).

The light-emitting elements ED may include active light-emitting elements EDa and dummy light-emitting elements EDd. Each of the active light-emitting elements EDa may have the first surface SU1 facing the first electrode E1 (or the base layer 100). The conductive pattern CP may be disposed between the active light-emitting elements EDa and the first electrode E1. The first surface SU1 of the active light-emitting elements EDa may be electrically connected to the first electrode E1 through the conductive pattern CP. Each of the dummy light-emitting elements EDd may have the second surface SU2 facing the first electrode E1 (or the base layer 100). The second surface SU2 of the dummy light-emitting elements EDd may directly contact the first electrode E1.

A ratio of the number of the active light-emitting elements EDa to the number of the entire light-emitting elements ED may be about 40% to about 60%. A ratio of the number of the dummy light-emitting elements EDd to the number of the entire light-emitting elements ED may be about 60% to about 40%. The number of the active light-emitting elements EDa and the number of the dummy light-emitting elements EDd may be substantially the same as or different from each other.

A fifth insulation layer 150 may be provided on the fourth insulation layer 140 and filled between the light-emitting elements ED. For example, a top surface of the fifth insulation layer 150 and the second surfaces SU2 of the active light-emitting elements EDa may provide a coplanar surface.

A second electrode E2 may be provided on the fifth insulation layer 150 and the light-emitting elements ED. The second electrode E2 may contact the second surfaces SU2 of the active light-emitting elements EDa. In other words, the second electrode E2 may be electrically connected to the second surface SU2 of each of the active light-emitting elements EDa. The second electrode E2 may be electrically connected to the second power line PL2 that is previously described with reference to FIG. 2. That is, the second voltage ELVSS in FIG. 2 may be applied to the second electrode E2.

Each of the connection electrode CCE, the first electrode E1, and the second electrode E2 may contain a conductive material. For example, the conductive material may include at least one of an indium zinc oxide (IZO), an indium tin oxide (ITO), an indium gallium oxide (IGO), an indium gallium zinc oxide (IGZO), and a combination thereof. However, the embodiment of the inventive concept is not limited thereto. For another example, the conductive material may be metal, and the metal may include molybdenum, silver, titanium, copper, aluminum, or an alloy thereof.

According to embodiments of the inventive concept, the first electrode E1 may be a p-type electrode, and the second electrode E2 may be an n-type electrode. Thus, as the p-type first electrode E1 and the p-type semiconductor layer adjacent to the first surface SU1 are electrically connected through the conductive pattern CP, and the n-type second electrode and the n-type semiconductor layer adjacent to the second surface SU2 are electrically connected, the active light-emitting element EDa may emit light when the display device operates. On the other hand, as the p-type first electrode E1 and the n-type semiconductor layer adjacent to the second surface SU2 contact each other, and the n-type second electrode E2 and the p-type semiconductor layer adjacent to the first surface SU1 contact each other, the dummy light-emitting element EDd may not emit light when the display device operates. Since about 40% to about 60% of the entire light-emitting elements ED are the active light-emitting elements EDa, each of the pixels PX1 to PX3 may function as a normal pixel.

A sixth insulation layer 160 may be provided on the second electrode E2. The sixth insulation layer 160 may have a flat top surface. A light shielding pattern BM and a color filter CF may be provided on the sixth insulation layer 160. The light shielding pattern BM may have an opening that vertically overlaps the recessed region RS, and the color filter CF may be provided in the opening. For example, the light shielding pattern BM may be a black matrix.

The color filter CF may include at least one of a red color filter, a green color filter, and a blue color filter. The color filer CF may receive light emitted from the light-emitting element ED and transmit only light in a specific wavelength. The color filter CF may convert a color of the light emitted from the light-emitting element ED into another color. For example, the color filter CF may include quantum dots. That is, the color filter CF may be a quantum dot color filter.

For example, the color filter CF may include a transparent material. When light emitted from the light-emitting element ED is blue, the color filter CF of a blue pixel may include only transparent material without quantum dots.

A cover layer CV may be provided on the light shielding pattern BM and the color filter CF. The cover layer CV may include transparent glass or transparent plastic. The cover layer CV may protect the color filter CF and the light-emitting elements ED.

Referring to FIG. 4B again, the light-emitting element ED may include a first semiconductor layer SL1, an active layer ACT, a second semiconductor layer SL2, and a third semiconductor layer SL3, which are sequentially stacked.

Each of the active layer ACT and the first to third semiconductor layers SL1, SL2, and SL3 may include a group III-V compound semiconductor. Each of the active layer ACT and the first to third semiconductor layers SL1, SL2, and SL3 may include GaN-based semiconductor. For example, each of the active layer ACT and the first to third semiconductor layers SL1, SL2, and SL3 may include at least one of GaN, AlN, AlGaN, InGaN, InN, InAlGaN, AlInN, and a combination thereof.

Each of the first to third semiconductor layers SL1, SL2, and SL3 may include the same GaN-based semiconductor. For example, each of the first to third semiconductor layers SL1, SL2, and SL3 may include GaN. The first semiconductor layer SL1 may be a p-type semiconductor layer. The first semiconductor layer SL1 may include impurities such as magnesium (Mg), zinc (Zn), strontium (Sr), or barium (Ba). The second semiconductor layer SL2 may be an n-type semiconductor layer. The second semiconductor layer SL2 may include impurities such as silicon (Si), germanium (Ge), tin (Sn), selenium (Se), or tellurium (Te). The third semiconductor layer SL3 may be an undoped semiconductor layer. For another example, the third semiconductor layer SL3 may be a n-type semiconductor layer.

The active layer ACT may be disposed between the first semiconductor layer SL1 and the second semiconductor layer SL2. The active layer ACT may be a region in which a hole injected through the first semiconductor layer SL1 and an electron injected through the second semiconductor layer SL2 are recombined. As the electron and the hole are recombined in the active layer ACT, light may be generated. The active layer ACT may have a single quantum well structure, a multiple quantum well structure, a quantum wire structure, or a quantum dot structure. For example, the active layer ACT may have a multiple quantum well structure including InGaN/GaN.

The first semiconductor layer SL1, the active layer ACT, the second semiconductor layer SL2, and the third semiconductor layer SL3 may be sequentially stacked on the first surface SU1 of the light-emitting element ED. Furthermore, the first semiconductor layer SL1, the active layer ACT, the second semiconductor layer SL2, and the third semiconductor layer SL3 may be sequentially stacked on a sidewall SW of the light-emitting element ED. In other words, each of the first semiconductor layer SL1, the active layer ACT, and the second semiconductor layer SL2 may have a U-shaped cross-section.

The active layer ACT adjacent to the sidewall SW of the light-emitting element ED may be disposed between the first semiconductor layer SL1 and the second semiconductor layer SL2. In other words, the active layer ACT adjacent to the sidewall SW of the light-emitting element ED may be covered by the first semiconductor layer SL1 and thus not exposed. The first semiconductor layer SL1 adjacent to the sidewall SW of the light-emitting element ED may passivate the active layer ACT. Since the active layer ACT is protected by the first semiconductor layer SL1, the active layer ACT may have improved electrical characteristics. As a result, the light-emitting element ED may have an improved light-emitting efficiency.

The sidewall SW of the light-emitting element ED according to an embodiment may be inclined with respect to the first surface SU1 or the second surface SU2. The light-emitting element ED may have a cross-section having a well-known truncated inverted pyramid shape by the inclined sidewall SW. In other words, the light-emitting element ED may have a width W that gradually increases in a direction away from the first surface SU1. The first surface SU1 of the light-emitting element ED may have an area less than that of the second surface SU2 of the light-emitting element ED.

The light-emitting element ED may have a height H that is defined as a vertical distance between the first surface SU1 and the second surface SU2 of the light-emitting element ED. A ratio (W/H) of the maximum width W to the height H of the light-emitting element ED may be about 1 to about 100. More specifically, the ratio (W/H) of the light-emitting element ED may be about 2 to about 50. The recessed region RS in FIG. 4A may have the depth DEP greater than the height H of the light-emitting element ED.

An insulation pattern IP may be provided on the sidewall SW of the light emitting element ED. The insulation pattern IP may include a reflection pattern RP covering the sidewall SW of the light-emitting element ED and a passivation pattern PP covering a portion of the second surface SU2 of the light-emitting element ED.

The reflection pattern RP of the insulation pattern IP may prevent light generated from the active layer ACT from being leaked through the sidewall SW of the light-emitting element ED. In other words, the reflection pattern RP may reflect light generated from the active layer ACT and induce the reflected light to be discharged through the second surface SU2 of the light-emitting element ED.

An electrical signal may be selectively applied to the first surface SU1 of the light-emitting element ED through the first electrode E1 and the conductive pattern CP. The electrical signal may not be applied to the sidewall SW of the light-emitting element ED by the insulation pattern IP.

The passivation pattern PP of the insulation pattern IP may cover a top surface of the first semiconductor layer SL1, a top surface of the active layer ACT, and a top surface of the second semiconductor layer SL2. The passivation pattern PP may selectively expose a top surface of the third semiconductor layer SL3. By the passivation pattern PP, the second electrode E2 may contact only the top surface of the third semiconductor layer SL3. By the passivation pattern PP, each of the first semiconductor layer SL1, the active layer ACT, and the second semiconductor layer SL2 may not be directly connected to the second electrode E2. In other words, the electrical signal may be selectively applied to the third semiconductor layer SL3 of the light-emitting element ED by the passivation pattern PP.

Referring to FIG. 5 again, the light-emitting elements ED that are randomly arranged in the recessed region RS of the first pixel PX1 will be described in detail. The light-emitting elements ED of the first pixel PX1 may include first to eighth light-emitting elements ED1 to ED8. Each of the first to eighth light-emitting elements ED1 to ED8 may have a center CG thereof. For example, the center CG of the light-emitting element ED may be a center of gravity of the light-emitting element ED.

A first center line CL1 passing the center CG of the first light-emitting elements ED1 may be defined. The first center line CL1 may be parallel to a longitudinal axis of the first light-emitting elements ED1. The first center line CL1 may be perpendicular to both sidewalls SW1 and SW2 of the first light-emitting elements ED1. In the same manner as the first center line CL1 of the first light-emitting elements ED1, second to fourth center lines CL2 to CL4 of second to fourth light-emitting elements ED2 to ED4 may be defined.

The first to fourth center lines CL1 to CL4 may not be parallel to each other. That is, since the light-emitting elements ED are randomly arranged, the first to fourth center lines CL1 to CL4 may not be parallel to each other. The first to fourth center lines CL1 to CL4 may cross each other. For example, the first center line CL1 and the second direction D2 have a first angle $\theta 1$, the second center line CL2 and the second direction D2 have a second angle $\theta 2$, the third center line CL3 and the second direction D2 have a third angle θ3, and the fourth center line CL4 and the second direction D2 have a fourth angle θ4. The first to fourth angles θ1 to θ4 may be different from each other.

The fifth light-emitting element ED5, the sixth light-emitting element ED6, and the eighth light-emitting element ED8 may be adjacent to the seventh light-emitting element ED7. A first virtual line VL1 connecting the center CG of the seventh light-emitting element ED7 and the center CG of the fifth light-emitting element ED5 may be defined, a second virtual line VL2 connecting the center CG of the seventh light-emitting element ED7 and the center CG of the sixth light-emitting element ED6 may be defined, and a third virtual line VL3 connecting the center CG of the seventh light-emitting element ED7 and the center CG of the eighth light-emitting element ED8 may be defined.

The first virtual line VL1, the second virtual line VL2, and the third virtual line VL3 may have different lengths from each other. In other words, the fifth light-emitting element ED5, the sixth light-emitting element ED6, and the eighth light-emitting element ED8 may be spaced by different distances from the seventh light-emitting element ED7

The first virtual line VL1 and the second virtual line VL2 may have a fifth angle θ5, and the second virtual line VL2 and the third virtual line VL3 may have a sixth angle θ6. The fifth angle θ5 and the sixth angle θ6 may be different from each other.

Figure 6:
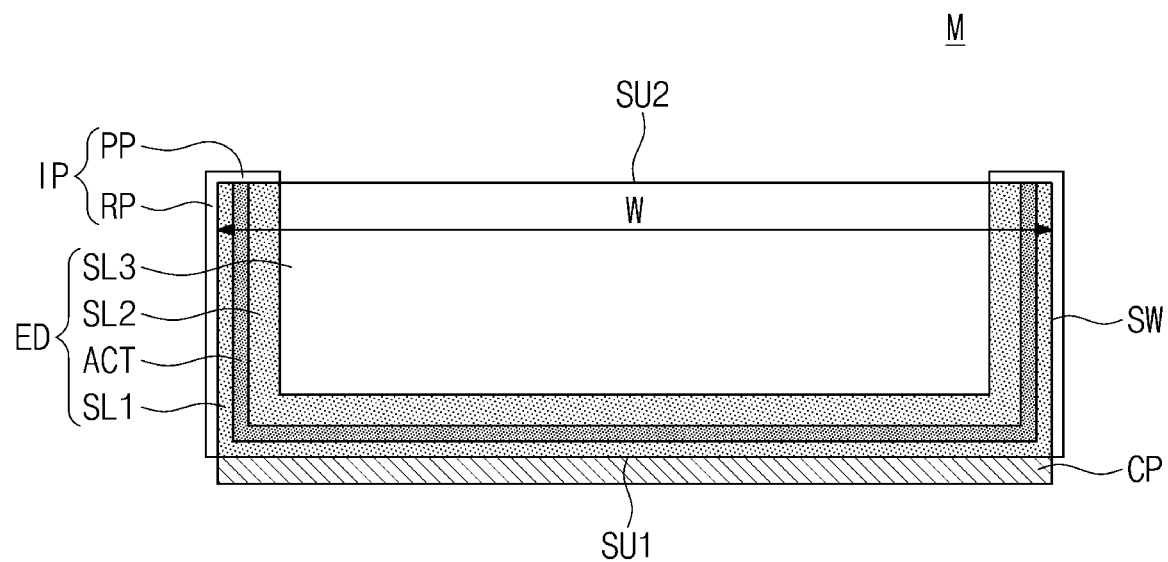
FIGS. 6 and 7 are enlarged cross-section views illustrating the region M of FIG. 4A for explaining a light-emitting element according to embodiments of the inventive concept.
Figure 7:
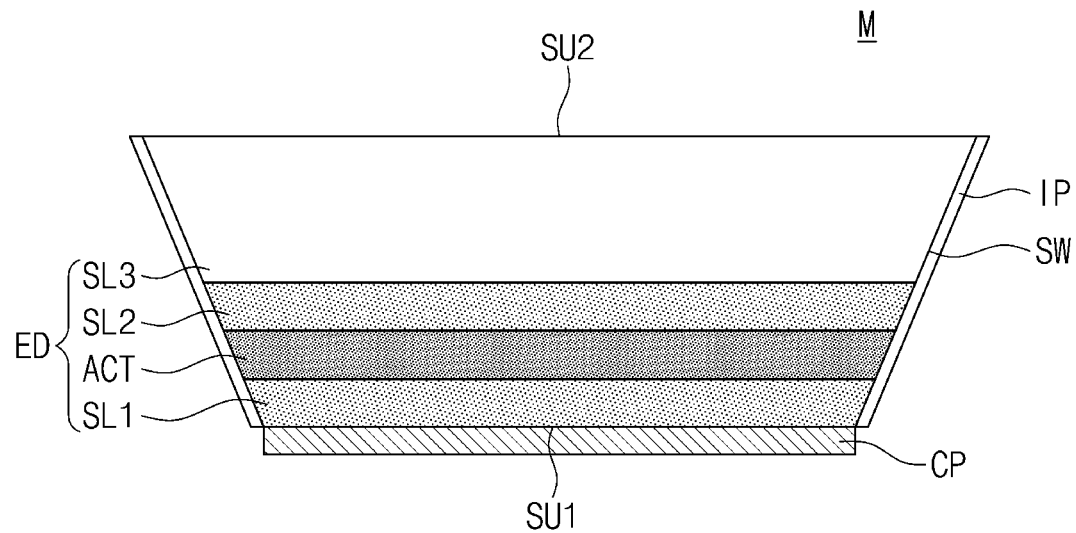

FIGS. 6 and 7 are enlarged cross-section views illustrating region M of FIG. 4A for explaining the light-emitting element according to embodiments of the inventive concept. In the embodiment, detailed description on the technical features overlapped with the light-emitting element described with reference to FIG. 4B will be omitted, and different points will be described in detail.

Referring to FIG. 6, a sidewall SW of a light emitting element ED may be substantially perpendicular to a first surface SU1 or a second surface SU2 of the light-emitting element. By the perpendicular sidewall SW, the light-emitting element ED may have a rectangular cross-section shape. In other words, the light-emitting element ED may have a width W that is substantially equally maintained even in a direction away from the first surface SU1. The first surface SU1 of the light-emitting element ED may have the substantially same area as the second surface SU2 of the light-emitting element ED.

Referring to FIG. 7, a first semiconductor layer SL1, an active layer ACT, a second semiconductor layer SL2, and the third semiconductor layer SL3 of the light-emitting element ED may be sequentially stacked on a first surface SU1. A sidewall SW of the light-emitting element ED may include a sidewall of the first semiconductor layer SL1, a sidewall of the active layer ACT, a sidewall of the second semiconductor layer SL2, and a sidewall of the third semiconductor layer SL3. An insulation pattern IP may cover the of the first semiconductor layer SL1, the sidewall of the active layer ACT, the sidewall of the second semiconductor layer SL2, and the sidewall of the third semiconductor layer SL3. In the embodiment, a passivation pattern PP covering a portion of a second surface SU2 of the light-emitting element ED may be omitted.

Figure 8:
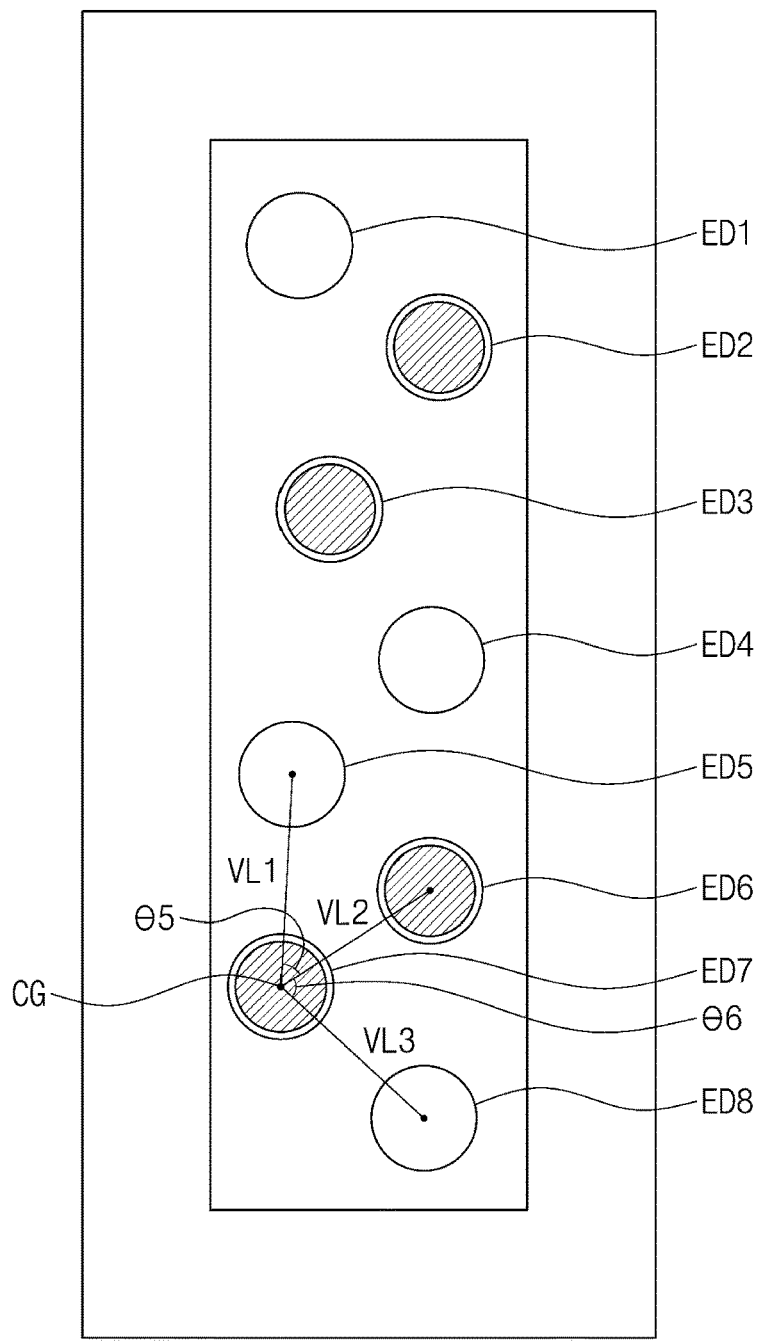
FIGS. 8 and 9 are enlarged plan-views illustrating a first pixel of FIG. 3 for explaining the display device according to embodiments of the inventive concept.
Figure 9:
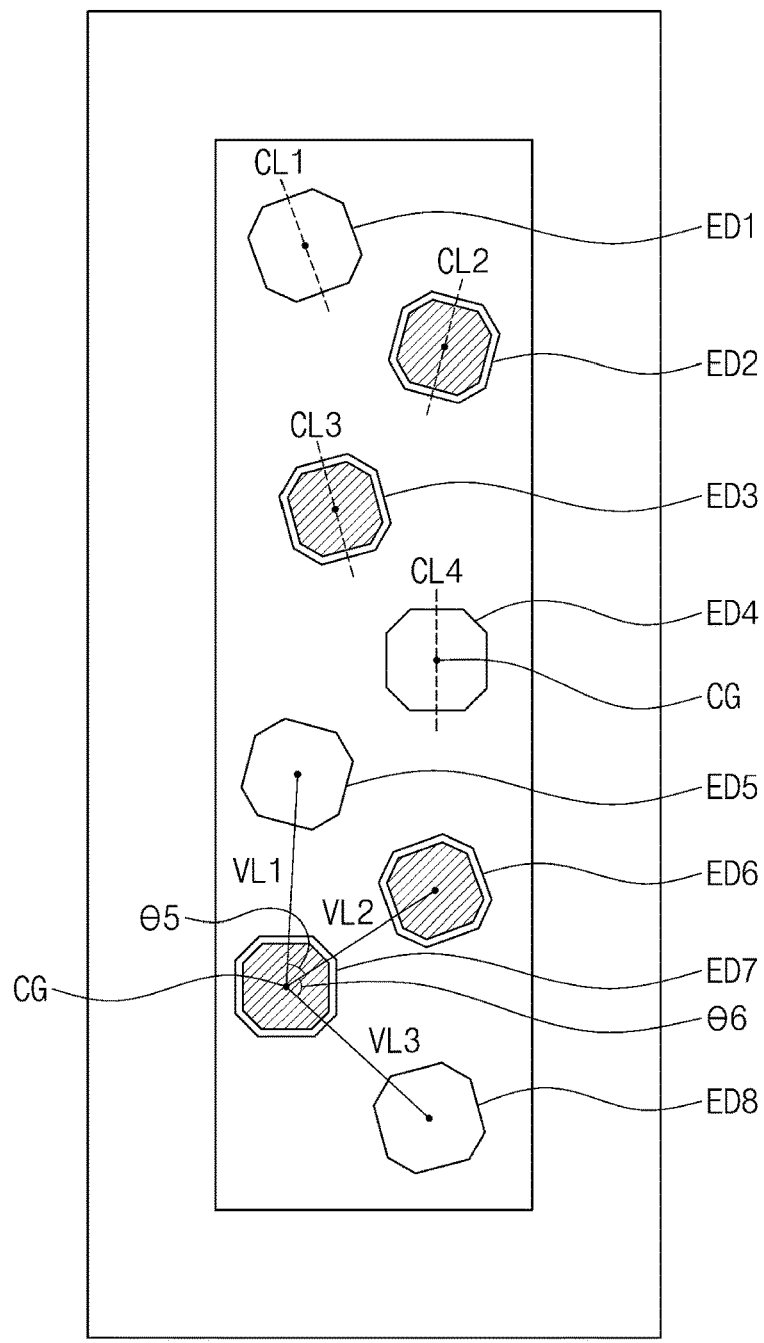

FIGS. 8 and 9 are enlarged plan-views illustrating the first pixel of FIG. 3 for explaining the display device according to embodiments of the inventive concept. In the embodiment, detailed description on the technical features overlapped with the first pixel described with reference to FIG. 5 will be omitted, and different points will be described in detail.

Referring to FIG. 8, the light-emitting elements ED may be randomly provided in the recessed region RS of the first pixel PX1. In terms of a plane, each of the light-emitting elements ED may have a circular shape. Since the light-emitting elements ED are randomly arranged, the first virtual line VL1, the second virtual line VL2, and the third virtual line VL3 may have different lengths from each other. Since the light-emitting elements ED are randomly arranged, the fifth angle θ5 between the first virtual line VL1 and the second virtual line VL2 and the sixth angle θ6 between the second virtual line VL2 and the third virtual line VL3 may be different from each other.

Referring to FIG. 9, in terms of the plane, each of the light-emitting elements ED may have a polygonal shape (e.g., an octagon).

FIGS. 10, 12, 14, and 16 are plan-views for explaining a method for manufacturing the display device according to embodiments of the inventive concept. FIGS. 11, 13, 15, and 17 are cross-section views taken along lines A-A' of FIGS. 10, 12, 14, and 16, respectively. FIG. 18 is a schematic view illustrating equipment for arranging the light-emitting elements according to embodiments of the inventive concept.

Figure 10:
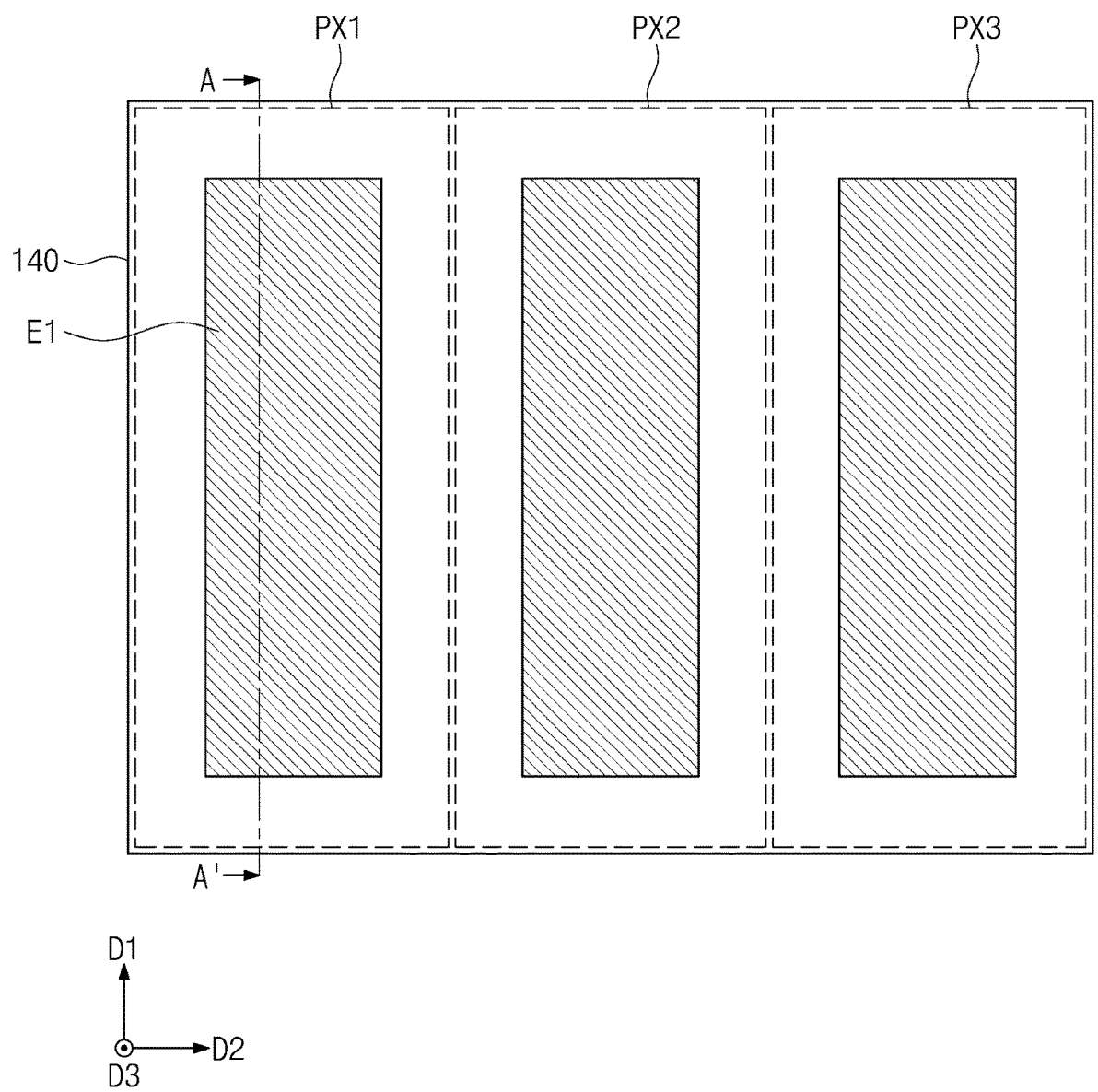
FIGS. 10, 12, 14, and 16 are plan-views for explaining a method for manufacturing the display device according to embodiments of the inventive concept.
Figure 11:
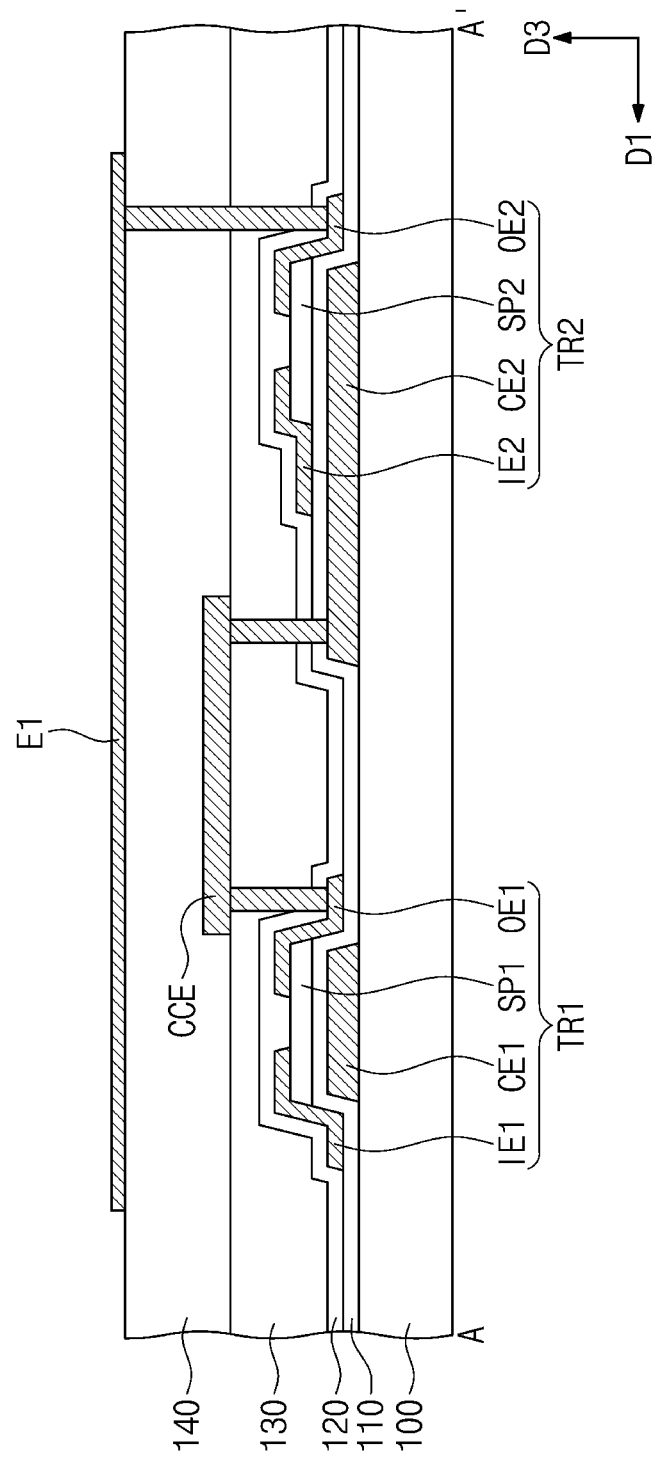
FIGS. 11, 13, 15, and 17 are cross-section views taken along lines A-A' of FIGS. 10, 12, 14, and 16, respectively.

Referring to FIGS. 10 and 11, a first thin-film transistor TR1 and a second thin-film transistor TR2 may be formed on a base layer 100. Forming of the first and second thin-film transistors TR1 and TR2 may include performing a LTPS or LTPO process. A connection electrode CCE that electrically connects the first and second thin-film transistors TR1 and TR2 to each other may be formed. A fourth insulation layer 140 may be formed on the connection electrode CCE. A first electrode E1 may be formed on the fourth insulation layer 140. The first electrode E1 may be electrically connected to the second thin-film transistor TR2.

Figure 12:
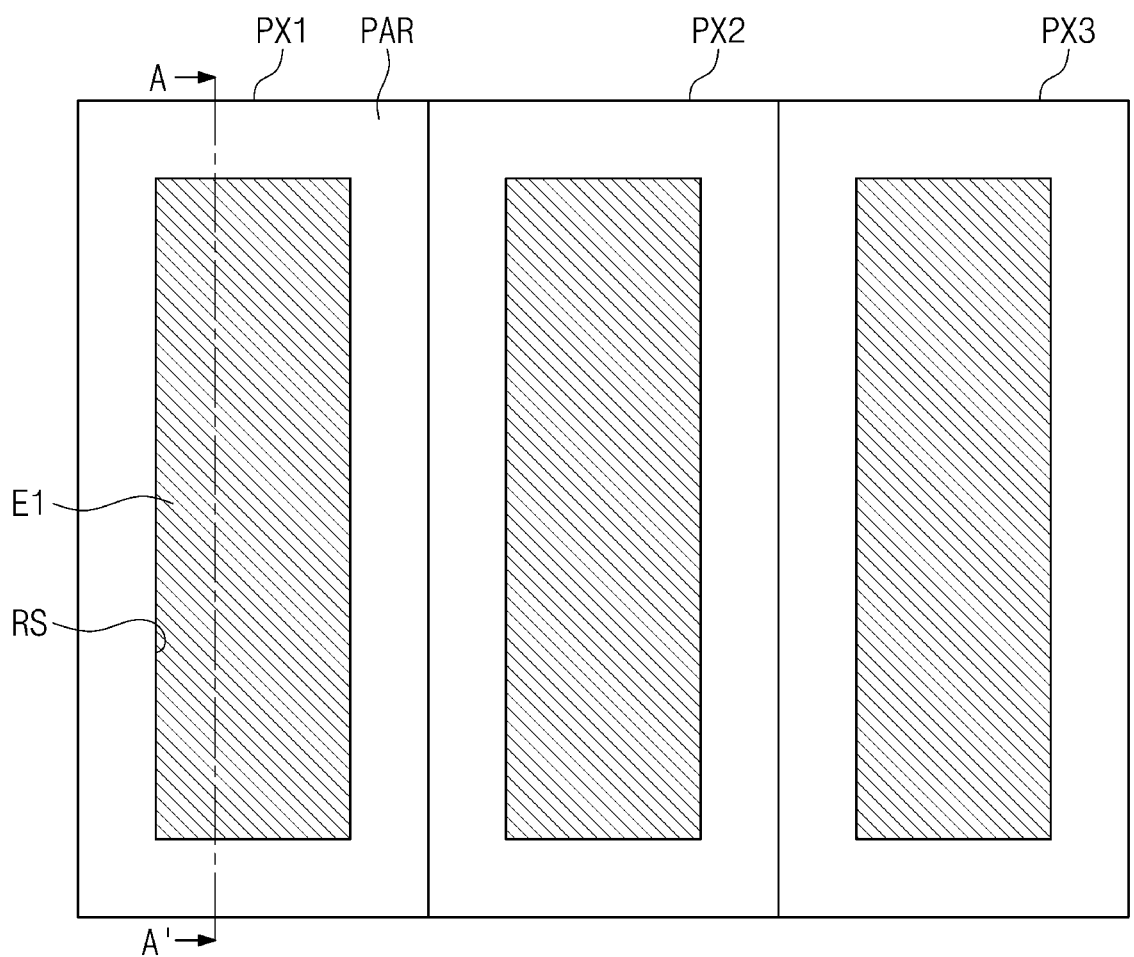
Figure 13:
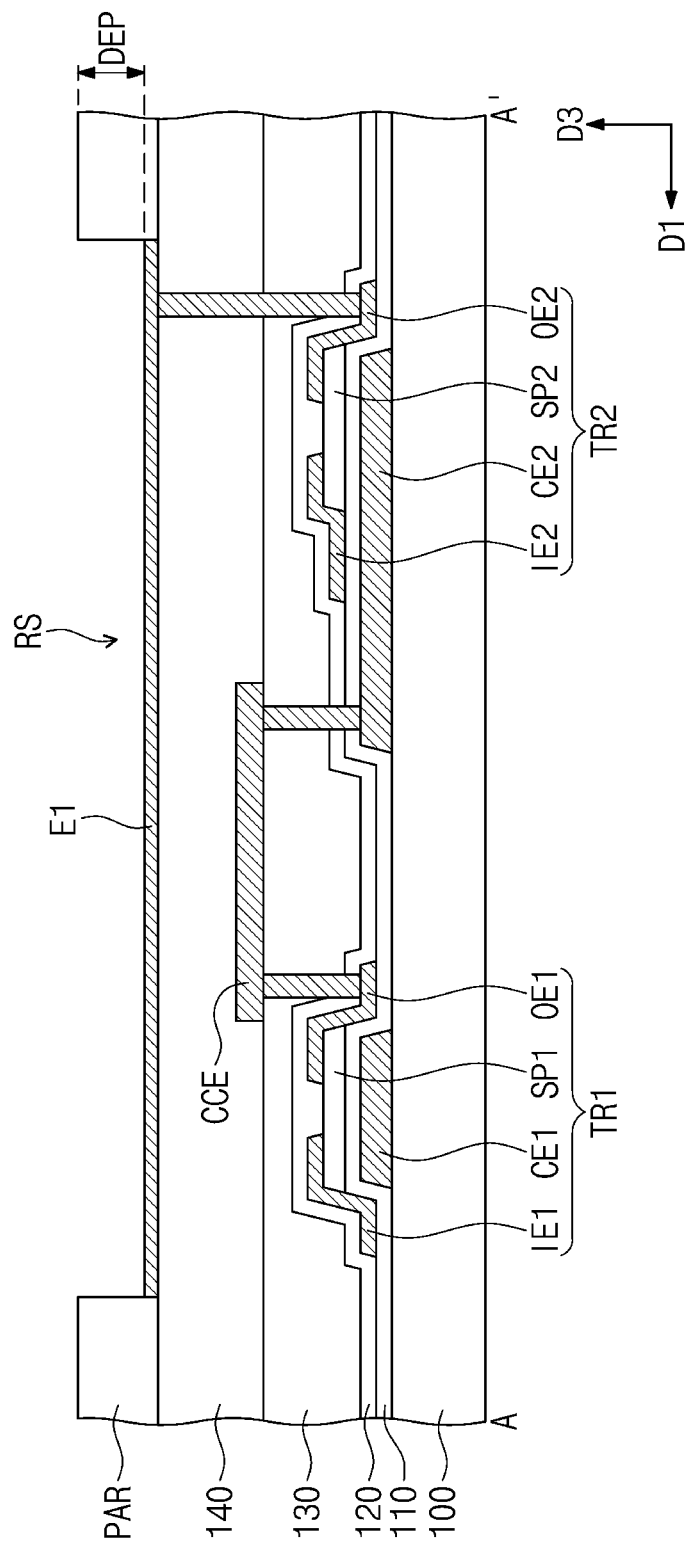

Referring to FIGS. 12 and 13, a partition structure PAR may be formed on the fourth insulation layer 140. The partition structure PAR may define a recessed region RS exposing a top surface of the first electrode E1. The recessed region RS may have a predetermined depth DEP.

Figure 14:
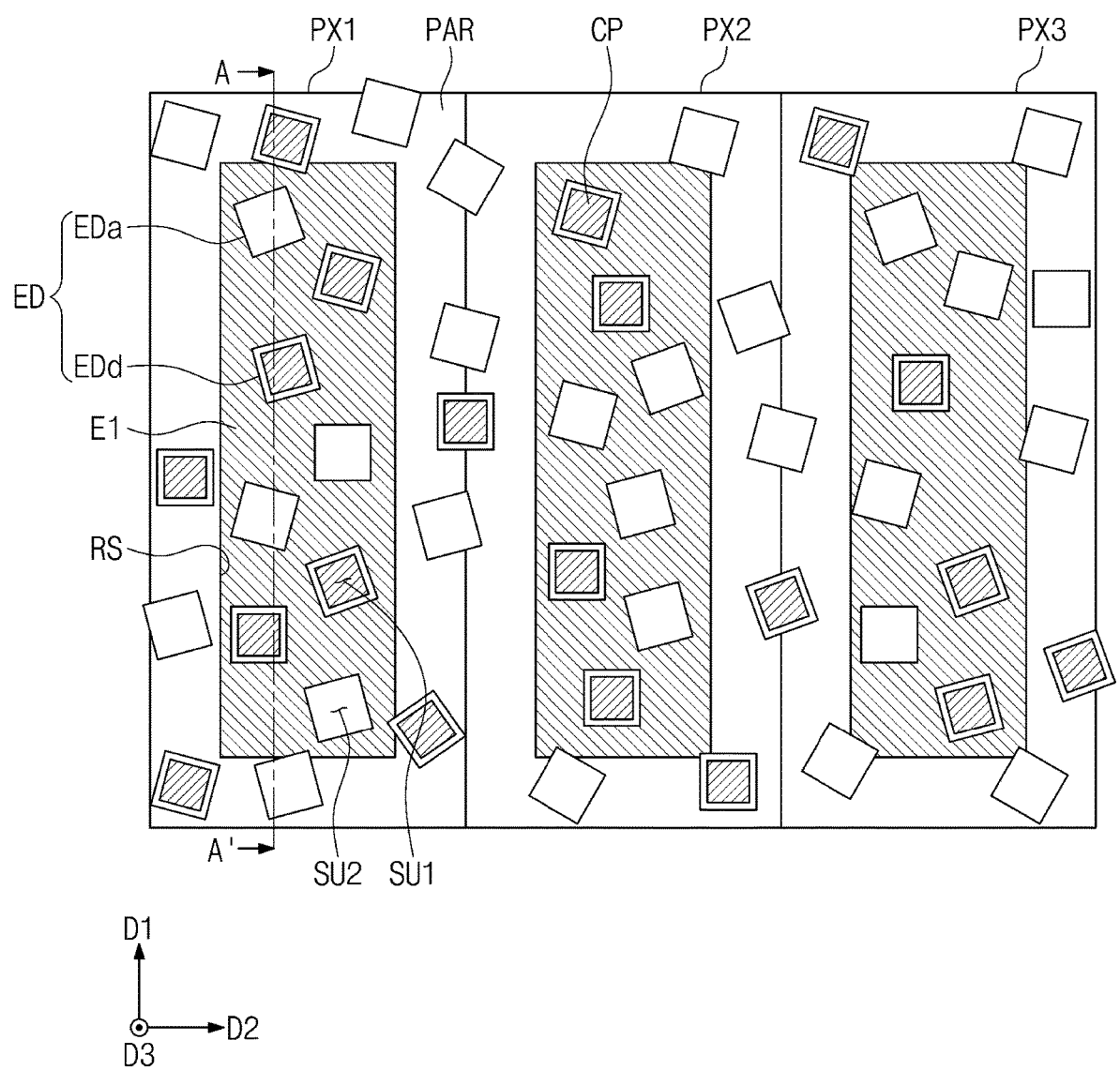
Figure 15:
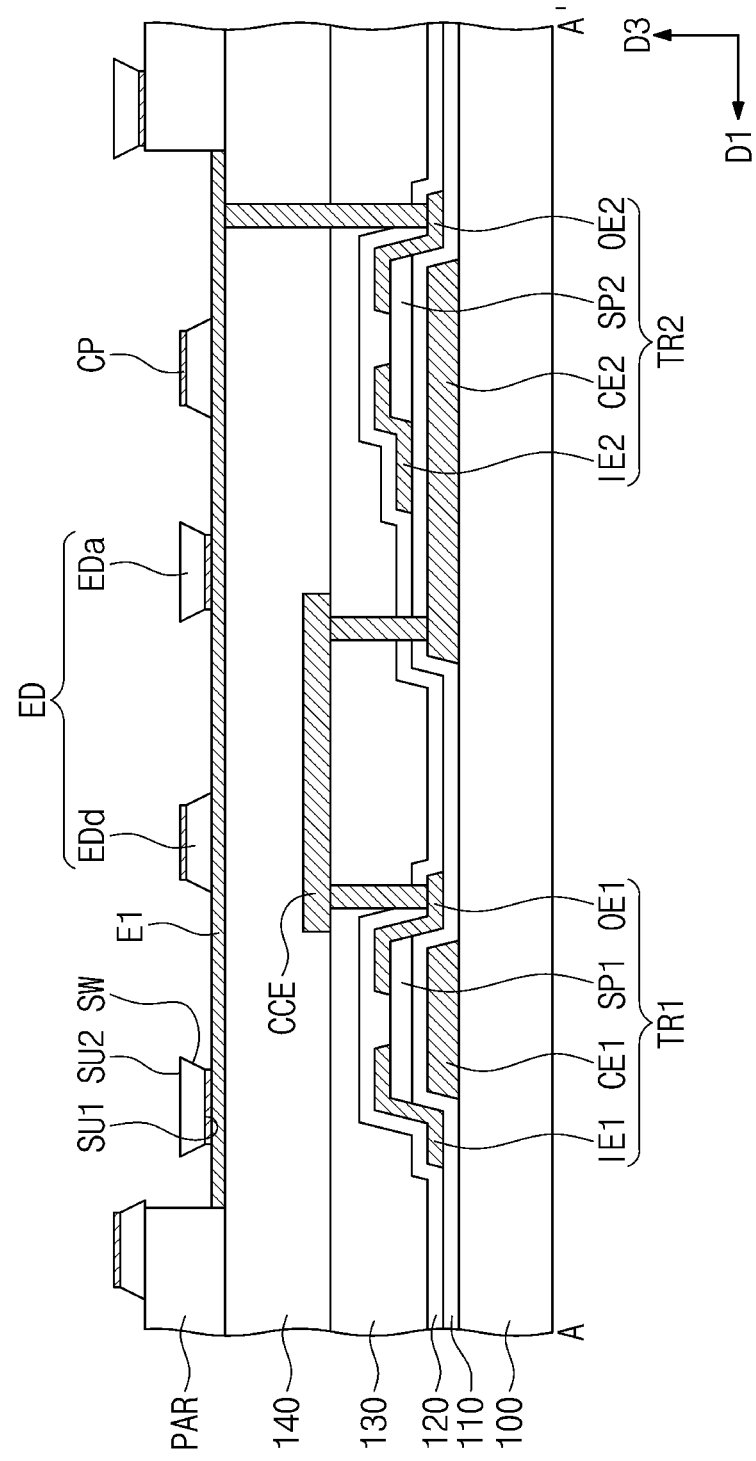

Referring to FIGS. 14, 15, and 18, light-emitting element arranging equipment LPA according to embodiments of the inventive concept may include a stage ST, a transferring unit TRP, a heat treatment unit ANP, and a control unit COP. The stage ST may load the base layer 100. The transferring unit TRP may connect the stage ST and the heat treatment unit ANP. The transferring unit TRP may transfer the base layer 100 from the stage ST to the heat treatment unit ANP or from the heat treatment unit ANP to the stage ST. The control unit COP may control the stage ST, the heat treatment unit ANP, and the transferring unit TRP.

The base layer 100 (i.e., the device shown in FIGS. 12 and 13) may be loaded on the stage ST. Light-emitting elements ED may be provided on the base layer 100. Since the light-emitting element ED is an light-emitting element having a size of about several nanometers to several hundred micrometers, a set of a plurality of light-emitting elements ED may form a powder. The providing of the light-emitting elements ED may include applying light-emitting element powder pED including a plurality of light-emitting elements ED on the base layer 100 (refer to FIG. 18).

The applied light-emitting elements ED may be uniformly distributed on the base layer 100 by vibrating the stage ST. The stage ST may be vibrated in the first direction D1 and the second direction D2. The control unit COP may control a frequency at which the stage ST vibrates and an amplitude by which the stage ST vibrates.

As described above, the light-emitting element ED according to embodiments of the inventive concept may have the first surface SU1 and the second surface SU2, which are opposite to each other. The conductive pattern CP may be attached on the first surface SU1 of the light-emitting element ED. A ratio of the maximum width to the height of the light-emitting element ED may be about 1 to about 100, more particularly, about 2 to about 50.

By controlling the stage ST, the light-emitting elements ED may be uniformly distributed on the base layer 100. Each of the light-emitting elements ED may be disposed so that the first surface SU1 faces the base layer 100 or the second surface SU2 faces the base layer 100. Since the light-emitting element ED has a width that is extremely greater than a height thereof, the light-emitting element ED may not be disposed in a standing state. That is, the sidewall SW of the light-emitting element ED may not face the base layer 100.

A portion of the light-emitting elements ED may be disposed on the first electrode E1 in the recessed region RS, and the rest of the light-emitting elements ED may be disposed on the partition structure PAR. The active light-emitting elements EDa of the light-emitting elements ED disposed on the first electrode E1 may be disposed so that the first surface SU1 faces the base layer 100. The dummy light-emitting elements EDd of the light-emitting elements ED disposed on the first electrode E1 may be disposed so that the second surface SU2 faces the base layer 100.

Since the light-emitting elements ED are randomly applied, the light-emitting elements ED on the first electrode E1 may be randomly arranged in a two-dimensional manner. For example, each of the light-emitting elements ED on the first electrode E1 may have fifty-fifty probability of being the active light-emitting element EDa or the dummy light-emitting element EDd.

Figure 16:
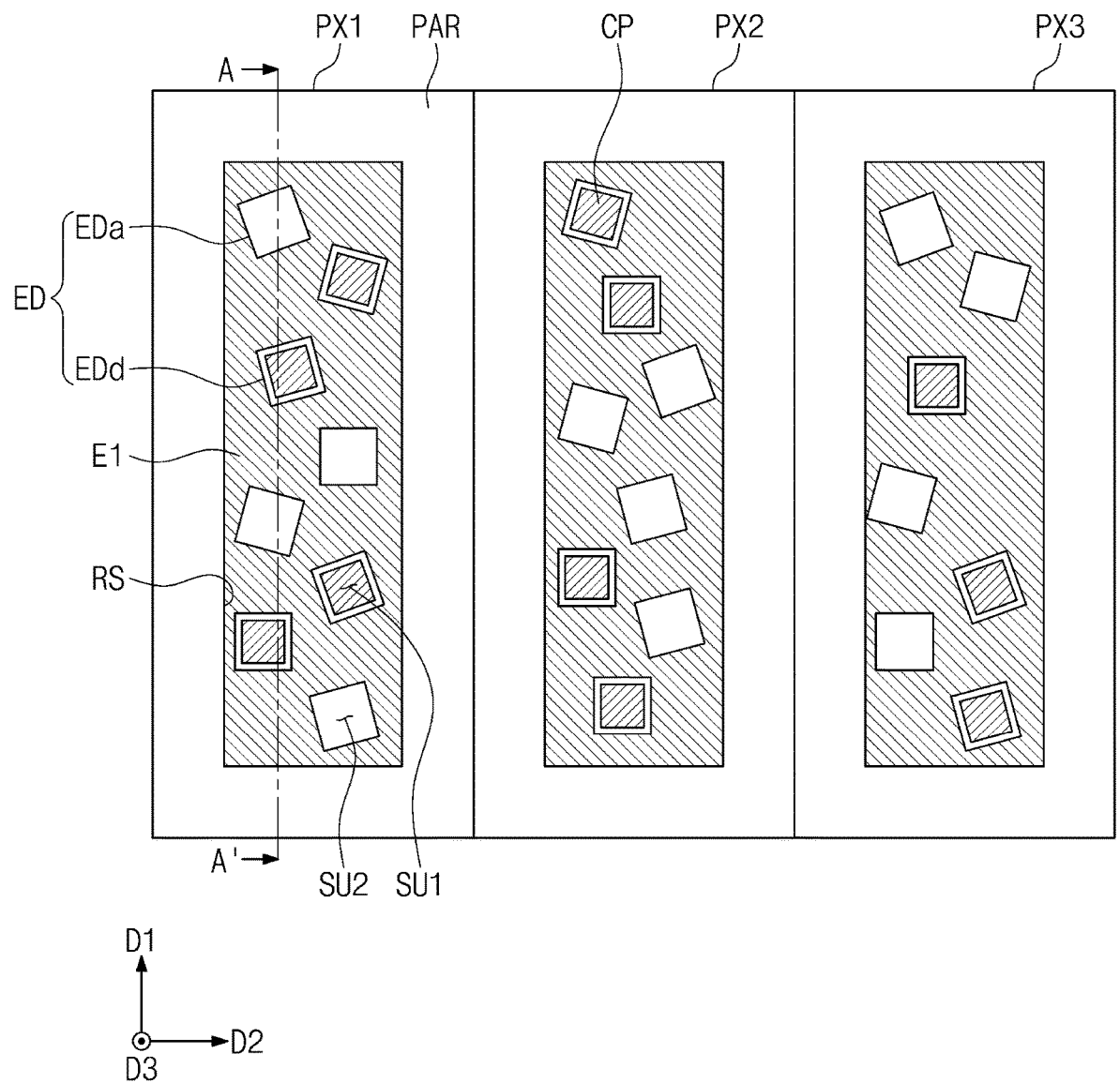
Figure 17:
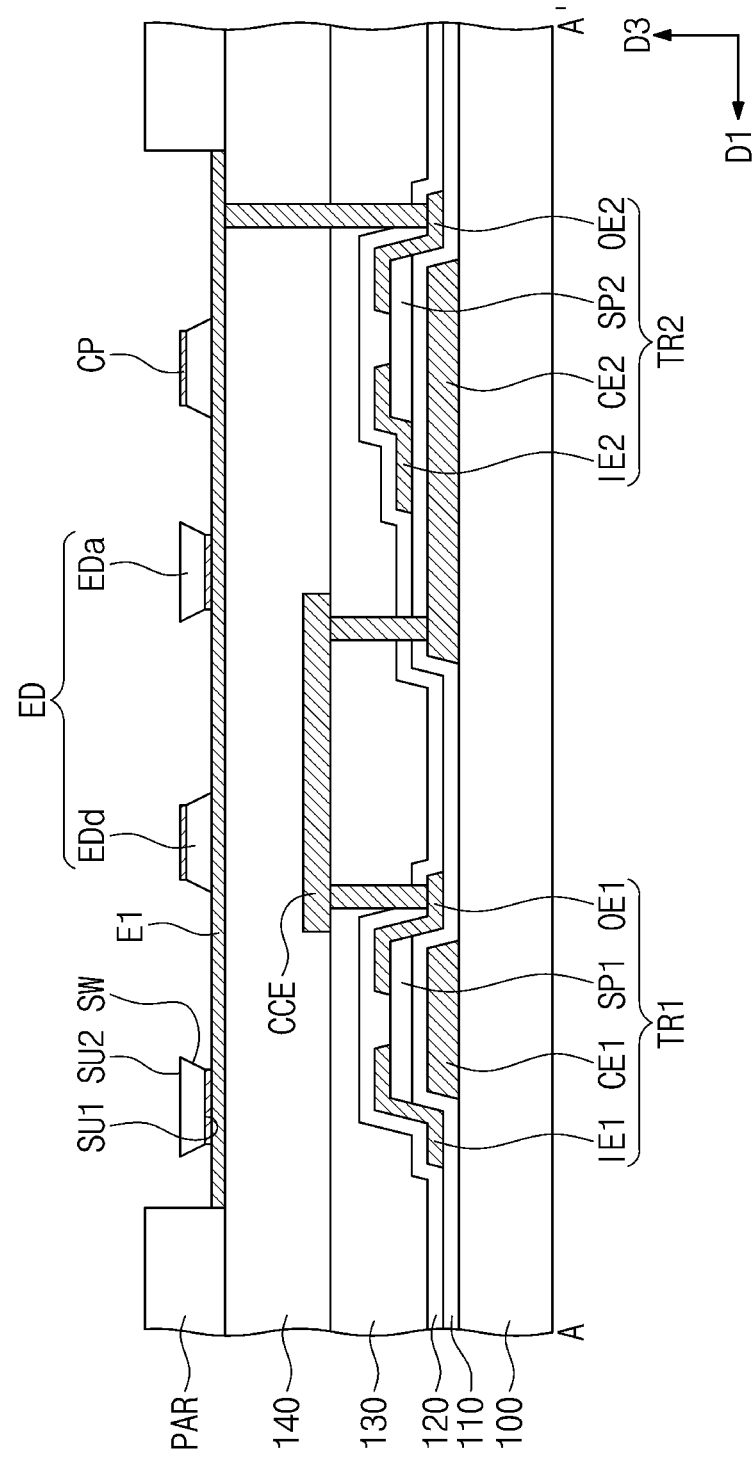
Figure 18:
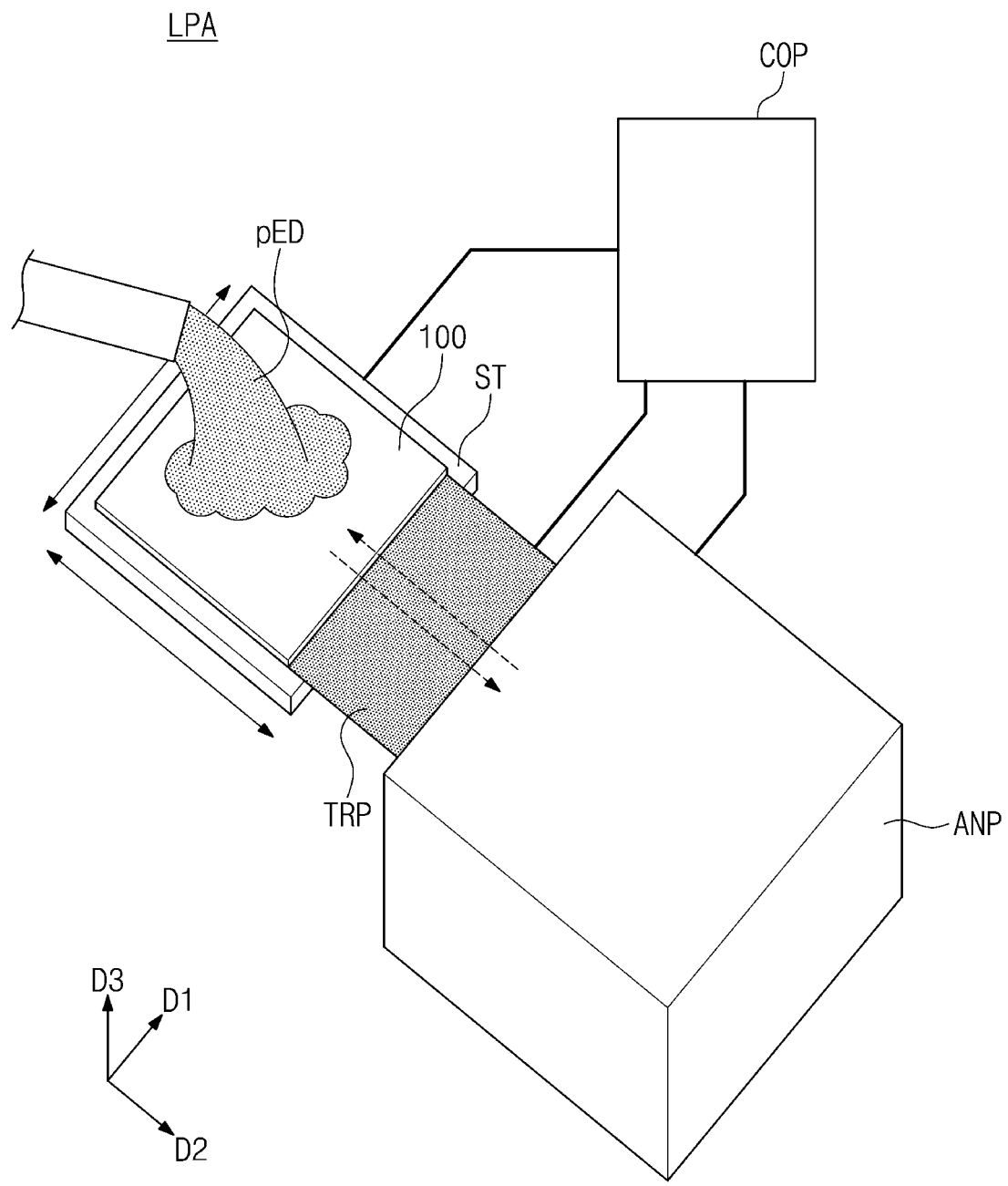
FIG. 18 is a schematic view illustrating equipment for arranging the light-emitting elements according to embodiments of the inventive concept.

Referring to FIGS. 16, 17, and 18, the light-emitting elements ED disposed on the partition structure PAR may be selectively removed. The base layer 100 may be transferred to the heat treatment unit ANP through the transfer unit TRP.

The heat treatment unit ANP may perform a heat treatment on the base layer 100. As the conductive pattern CP between the active light-emitting element EDa and the first electrode E1 is melted by the heat treatment, the conductive pattern CP may be attached on the top surface of the first electrode E1. In other words, the active light-emitting elements EDa may be attached and fixed onto the first electrode E1. The heat treatment may include spike anneal or electromagnetic induction anneal.

Referring to FIGS. 3 and 4A again, the fifth insulation layer 150 filling a portion between the light-emitting elements ED may be formed. The second electrode E2 may be formed on the fifth insulation layer 150. The second electrode E2 may be electrically connected to the second surfaces SU2 of the active light-emitting elements EDa.

The sixth insulation layer 160 may be formed on the second electrode E2. The light shielding pattern BM and the color filter CF may be formed on the sixth insulation layer 160. The light shielding pattern BM may be a black matrix. The color filter CF may include at least one of a red color filter, a green color filter, and a blue color filter. The cover layer CV may be formed on the light shielding pattern BM and the color filter CF.

The method for manufacturing according to the embodiments of the inventive concept may realize the display device by randomly arranging the light-emitting elements on the pixel. Since the light-emitting elements each having a great ratio of a maximum width to a height are disposed on the pixel, about 50% of the disposed light-emitting elements may function as the active light-emitting element. As a result, as the light-emitting elements are randomly arranged on the pixel instead of uniformly aligning the light-emitting elements on the pixel, the display device having a large area may be quickly and economically manufactured.

Figure 19:
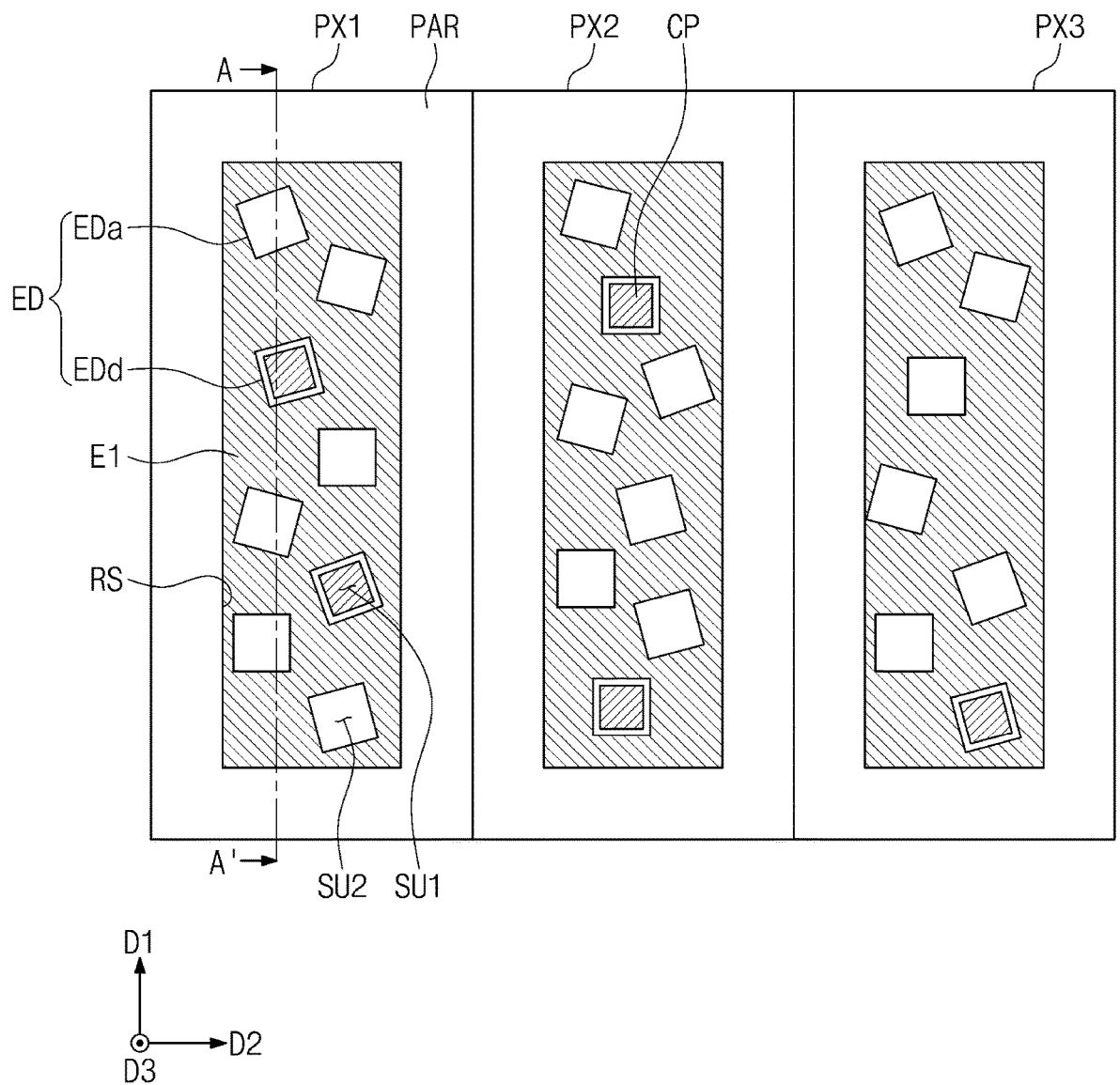
FIG. 19 is a plan-view illustrating pixels of a display device according to embodiments of the inventive concept.
Figure 20:
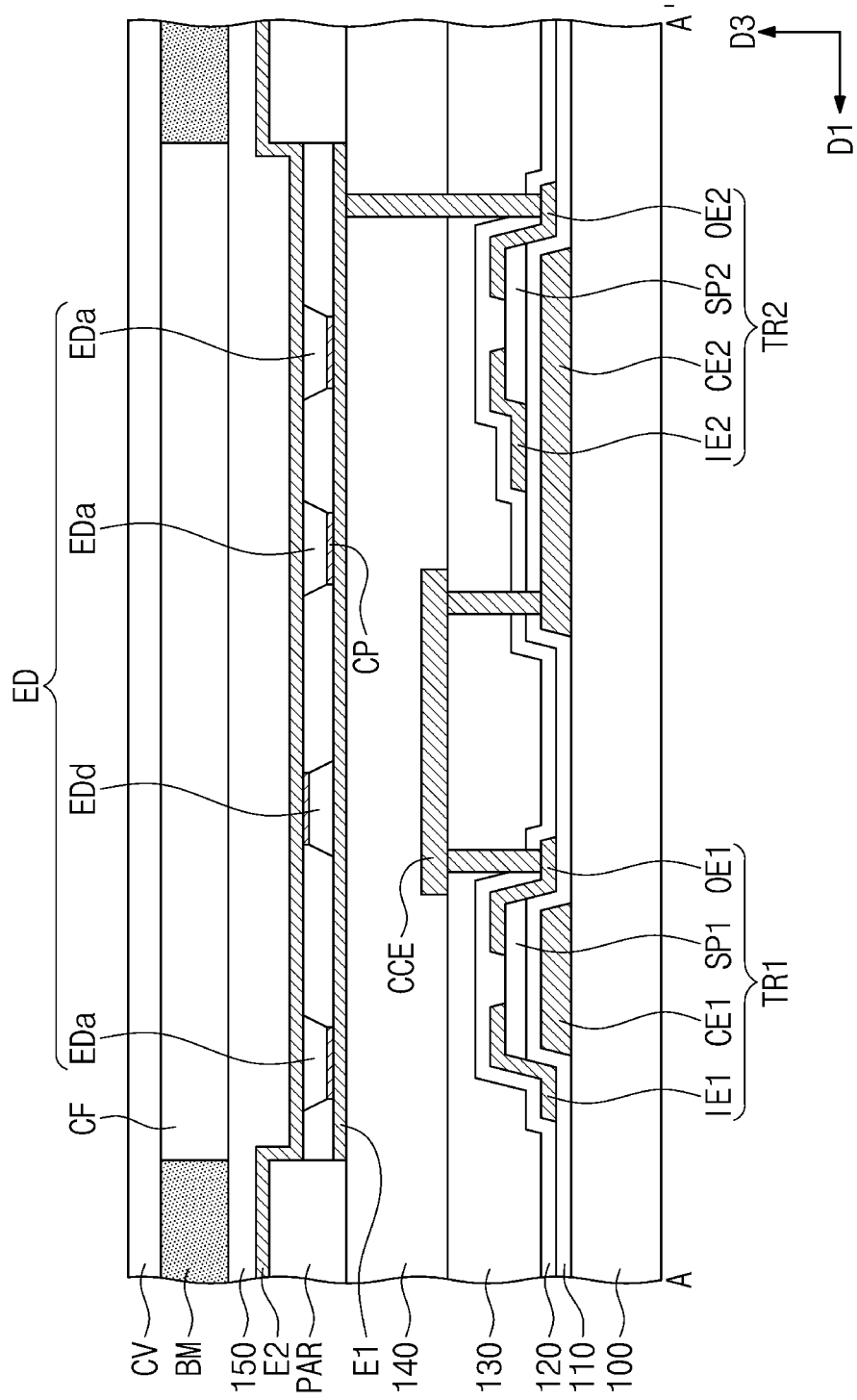
FIG. 20 is a cross-section view taken along line A-A' of FIG. 19.

FIG. 19 is a plan-view illustrating pixels of the display device according to the embodiments of the inventive concept. FIG. 20 is a cross-section view taken along line A-A' of FIG. 19. In the embodiment, detailed description on the technical features overlapped with the display device described with reference to FIGS. 3, 4A, 4B, and 5 will be omitted, and different points will be described in detail.

Referring to FIGS. 19 and 20, the number of the active light-emitting elements EDa may be greater than that of the dummy light-emitting elements EDd in the first to third pixels PX1 to PX3. That is, a ratio of the number of the active light-emitting elements EDa to the number of the entire light-emitting elements ED may be greater than that of the number of the dummy light-emitting elements EDd to the number of the entire light-emitting elements ED. For example, the light-emitting elements ED in the first pixel PX1 may include six active light-emitting elements EDa and two dummy light-emitting elements EDd.

Figure 21:
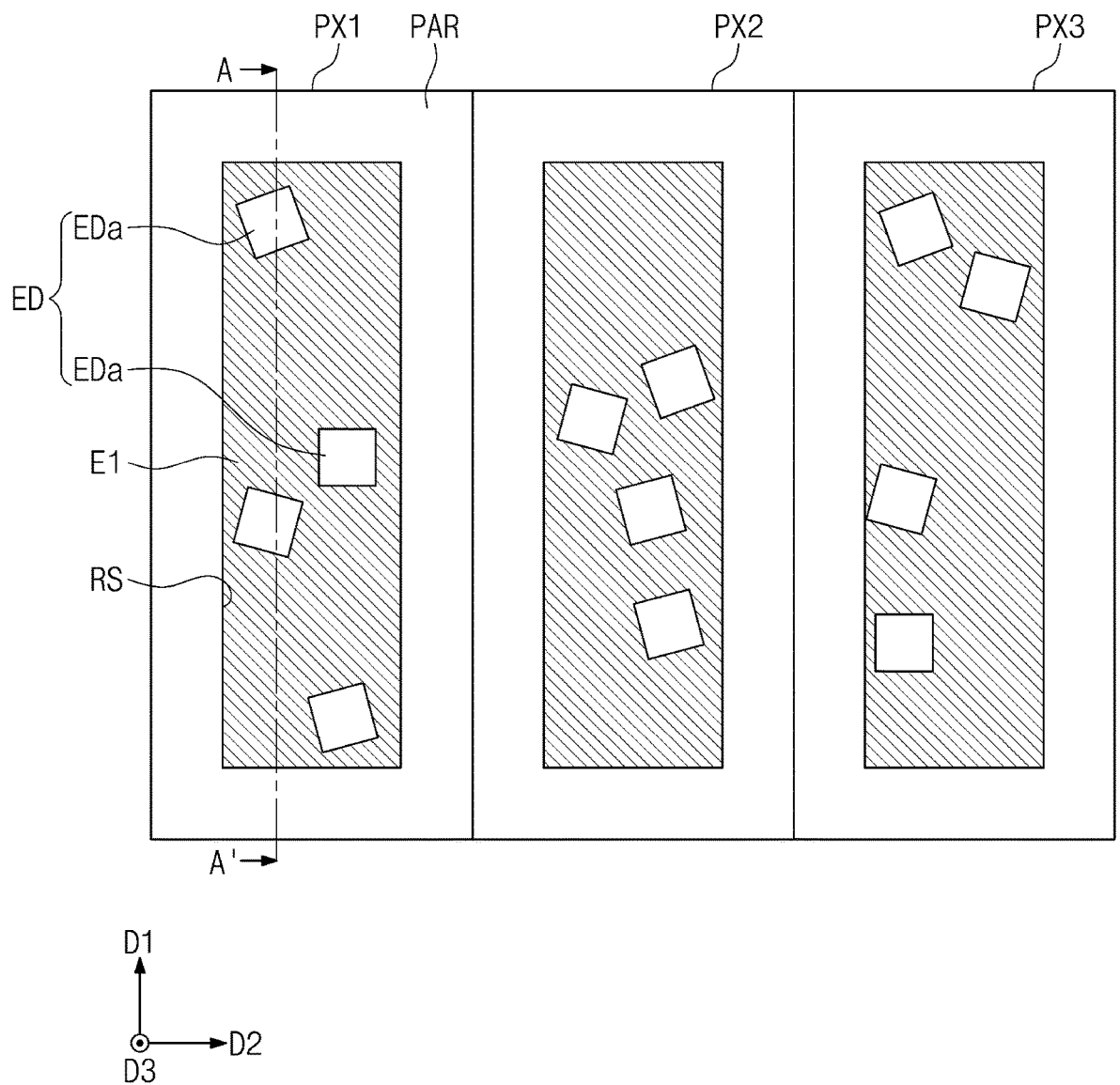
FIGS. 21 and 23 are plan-views for explaining a method for manufacturing the display device in FIGS. 19 and 20.
Figure 22:
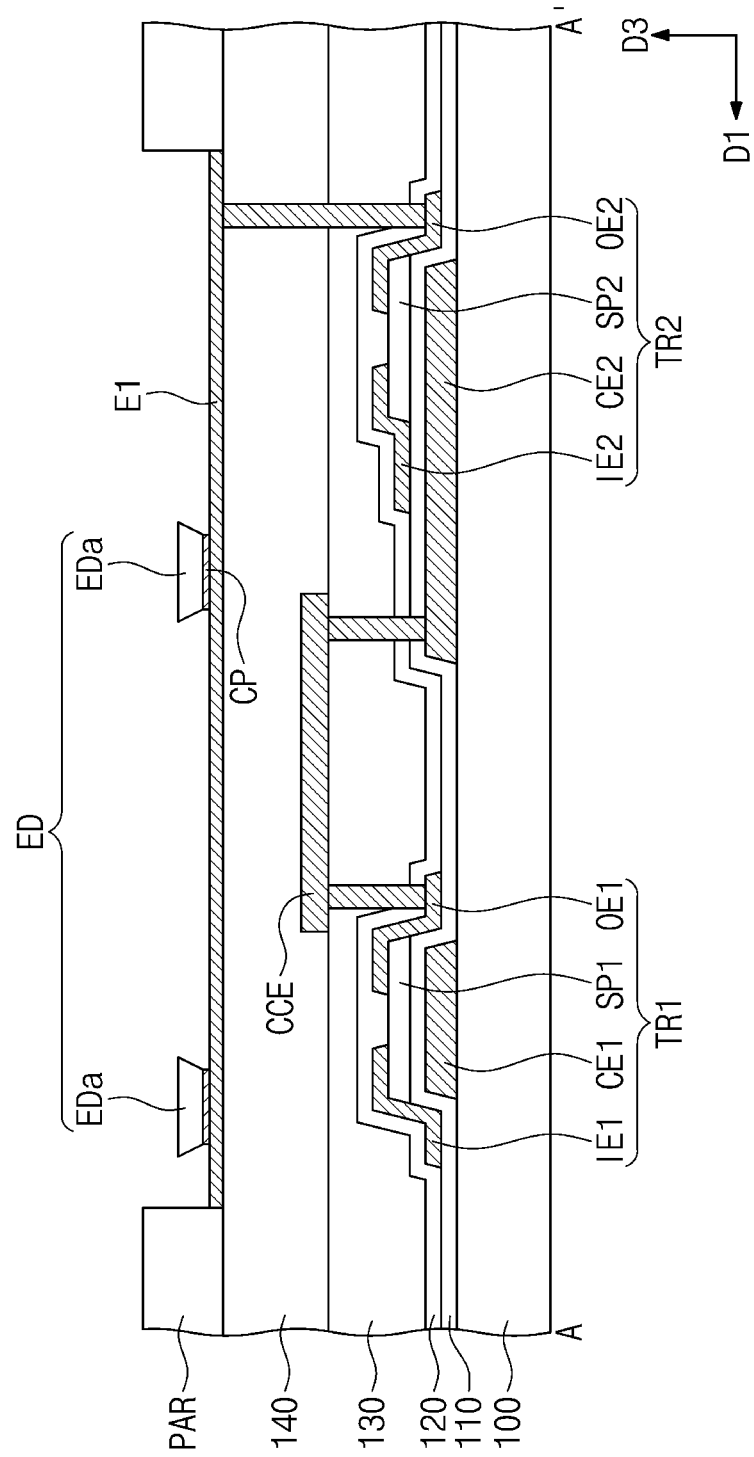
FIGS. 22 and 24 are cross-section views taken along lines A-A' in FIGS. 21 and 23.
Figure 23:
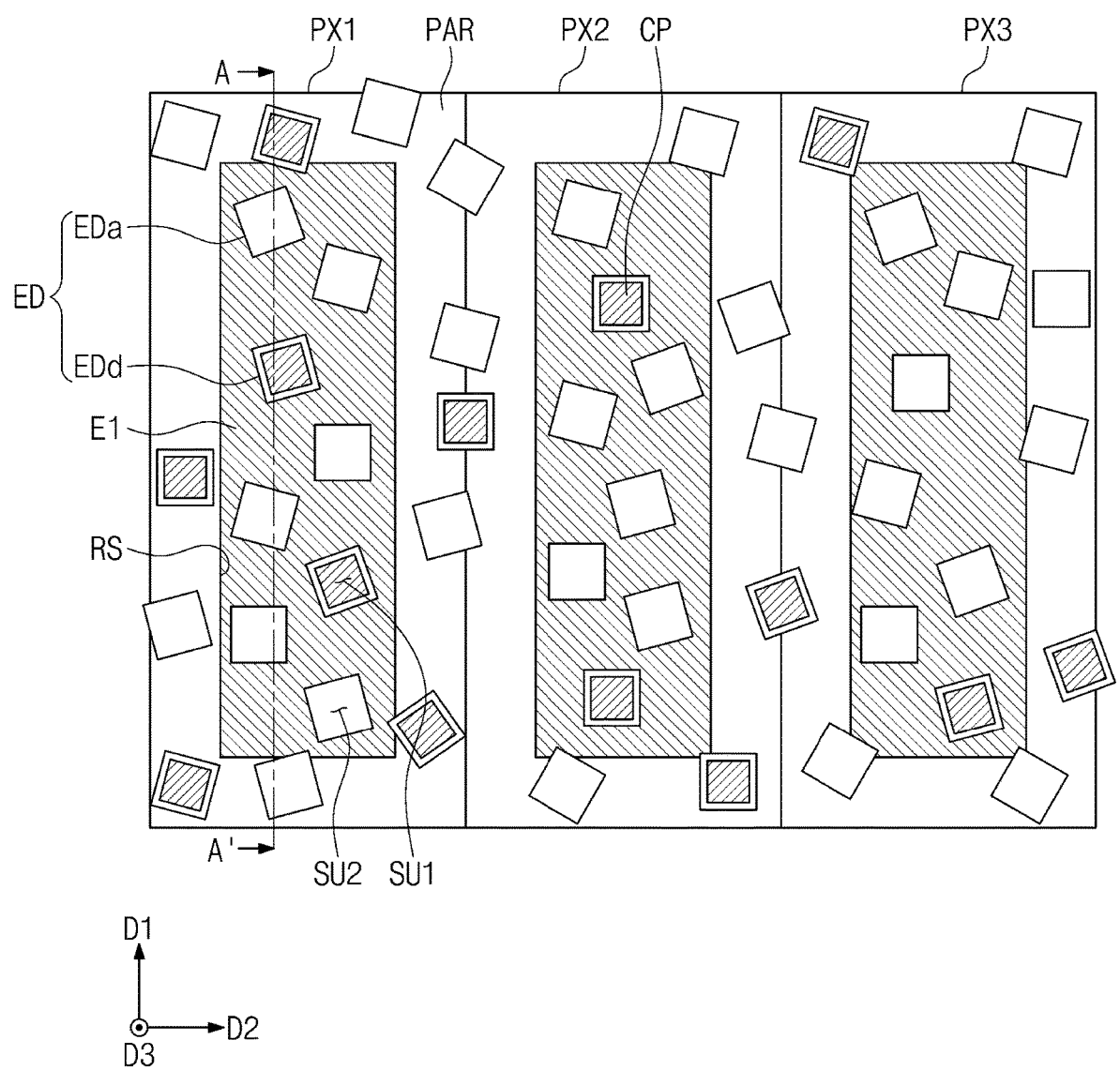
Figure 24:
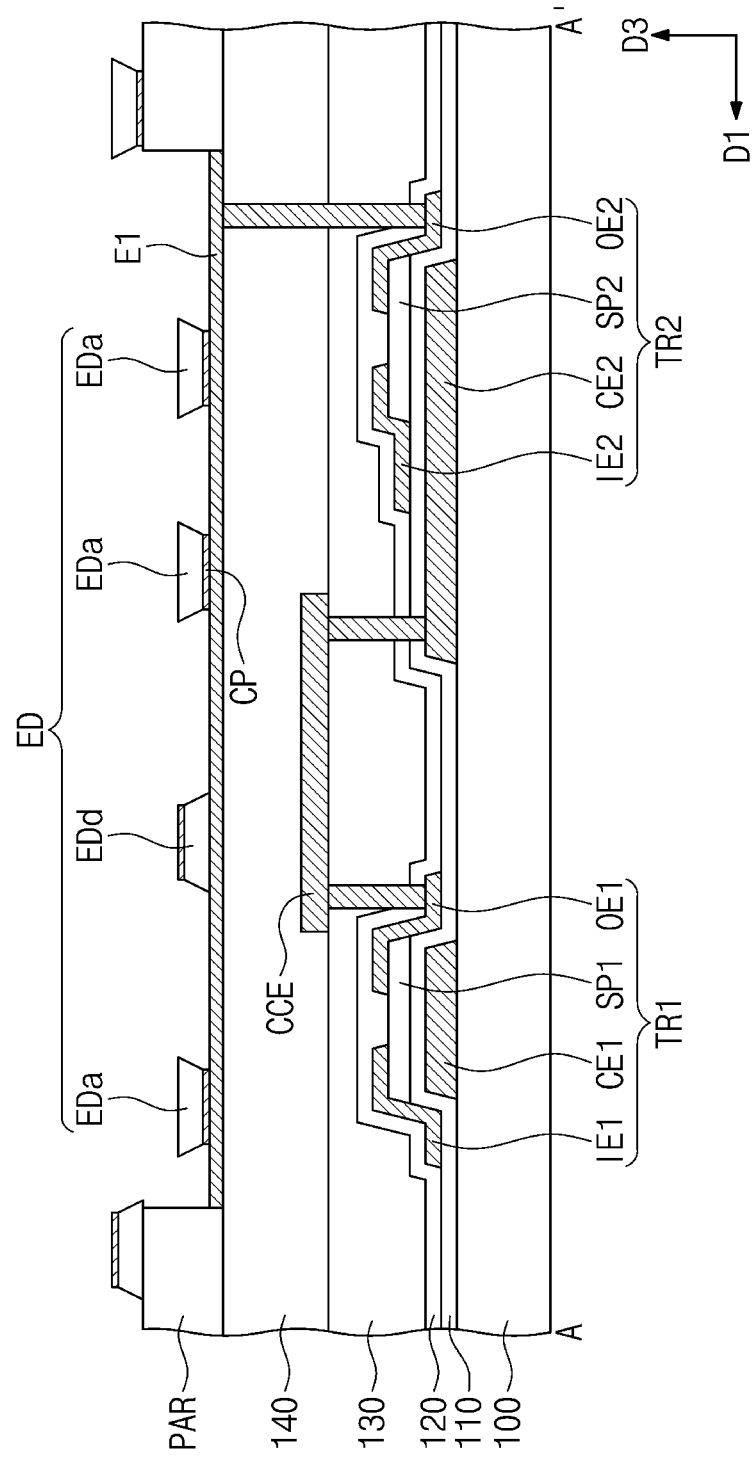

FIGS. 21 and 23 are plan-views for explaining the method for manufacturing the display device in FIGS. 19 and 20. FIGS. 22 and 24 are cross-section views taken along lines A-A' in FIGS. 21 and 23. In the embodiment, detailed description on the technical features overlapped with the manufacturing method described with reference to FIGS. 10 to 18 will be omitted, and different points will be described in detail.

Referring to FIGS. 21 and 22, the dummy light-emitting elements EDd that are not attached on an output of FIGS. 16 and 17 may be removed. That is, only the active light-emitting elements ED attached on the first electrode E1 by heat treatment may be remained on the first electrode E1.

Referring to FIGS. 23 and 24, the light-emitting elements ED may be applied on the base layer 100 and uniformly distributed on the base layer 100. That is, application and distribution of the light-emitting elements ED previously described in FIGS. 14, 15, and 18 may be performed again. Since the light-emitting elements ED are randomly arranged in the rest area of the first electrode E1 except for an area in which the remained active light-emitting elements EDa are disposed, resultantly, the number of the active light-emitting elements EDa disposed on the first electrode E1 may be greater than the number of the dummy light-emitting elements EDd disposed on the first electrode E1. Thereafter, the heat treatment may be performed on the base layer 100 again. The second electrode E2 and the color filter CF may be formed on the light-emitting elements ED.

Figure 25:
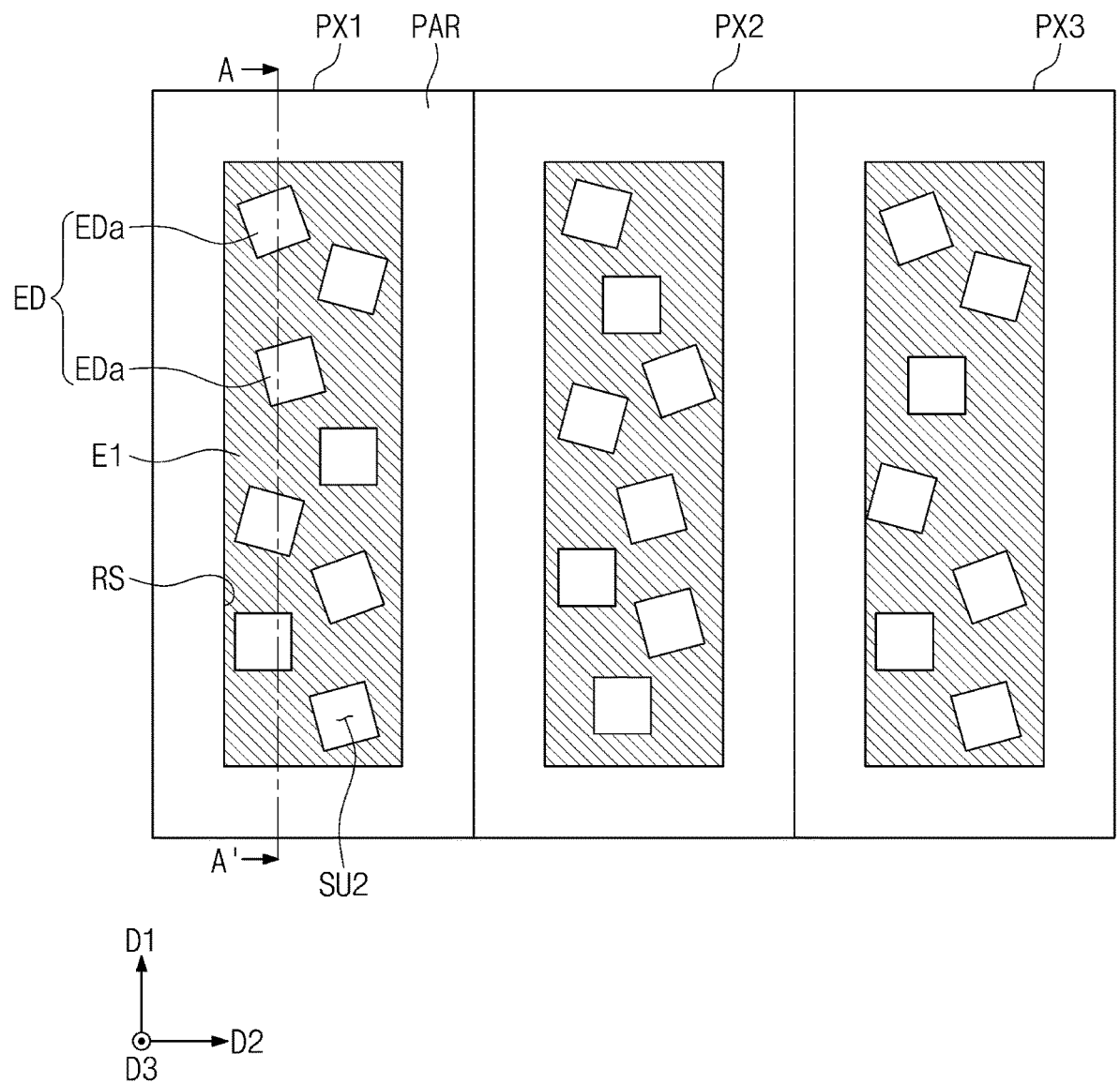
FIG. 25 is a plan-view illustrating pixels of a display device according to embodiments of the inventive concept.
Figure 26:
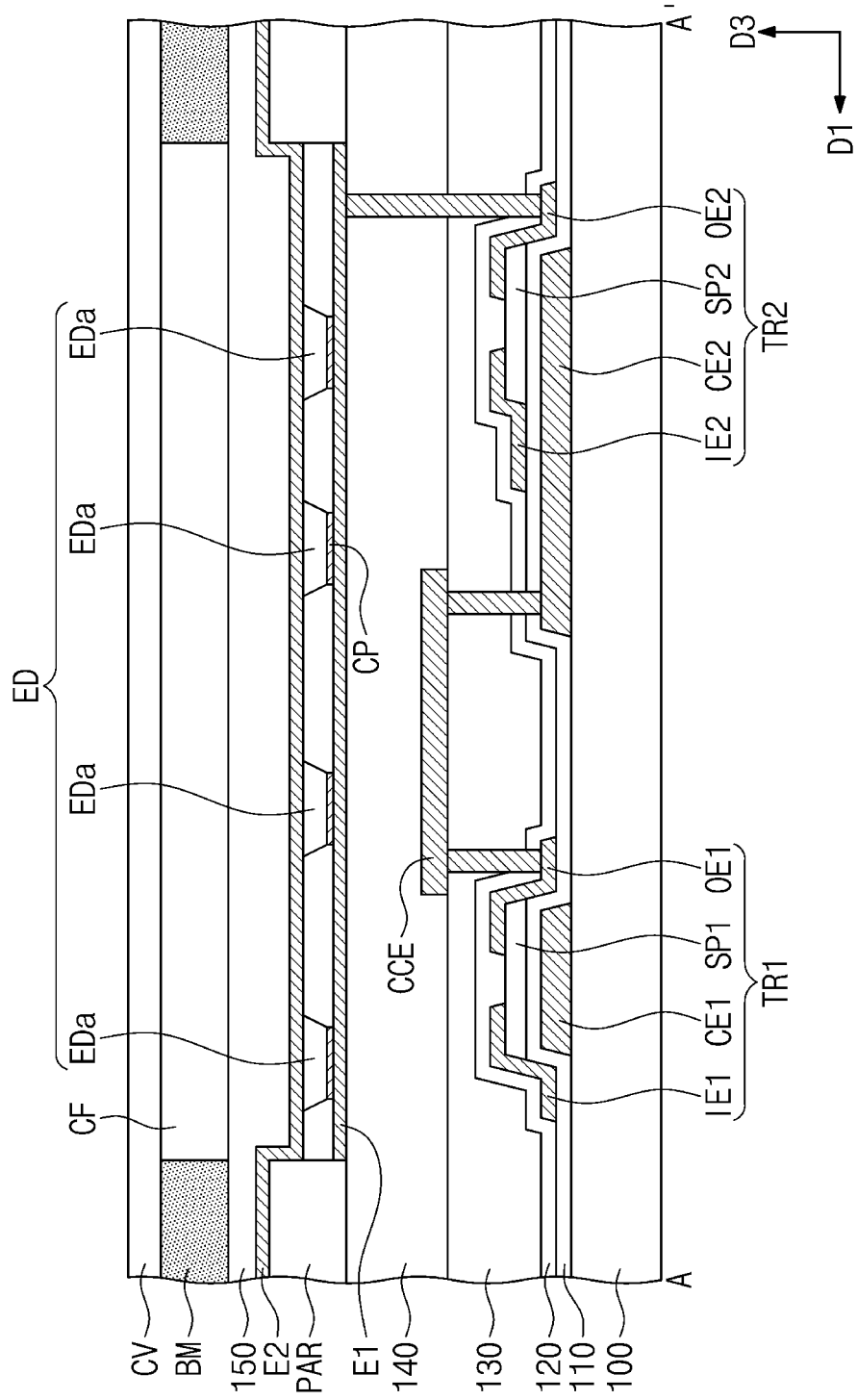
FIG. 26 is a cross-section view taken along line A-A' of FIG. 25.

FIG. 25 is a plan-view illustrating pixels of a display device according to the embodiments of the inventive concept. FIG. 26 is a cross-section view taken along line A-A' of FIG. 25. In the embodiment, detailed description on the technical features overlapped with the display device described with reference to FIGS. 3, 4A, 4B, and 5 will be omitted, and different points will be described in detail.

Referring to FIGS. 25 and 26, light-emitting elements ED may include only active light-emitting elements EDa. That is, unlike the display device previously described with reference to FIGS. 3, 4A, 4B, and 5, dummy light-emitting elements EDd may be omitted from the display device according to the embodiment.

Figure 27:
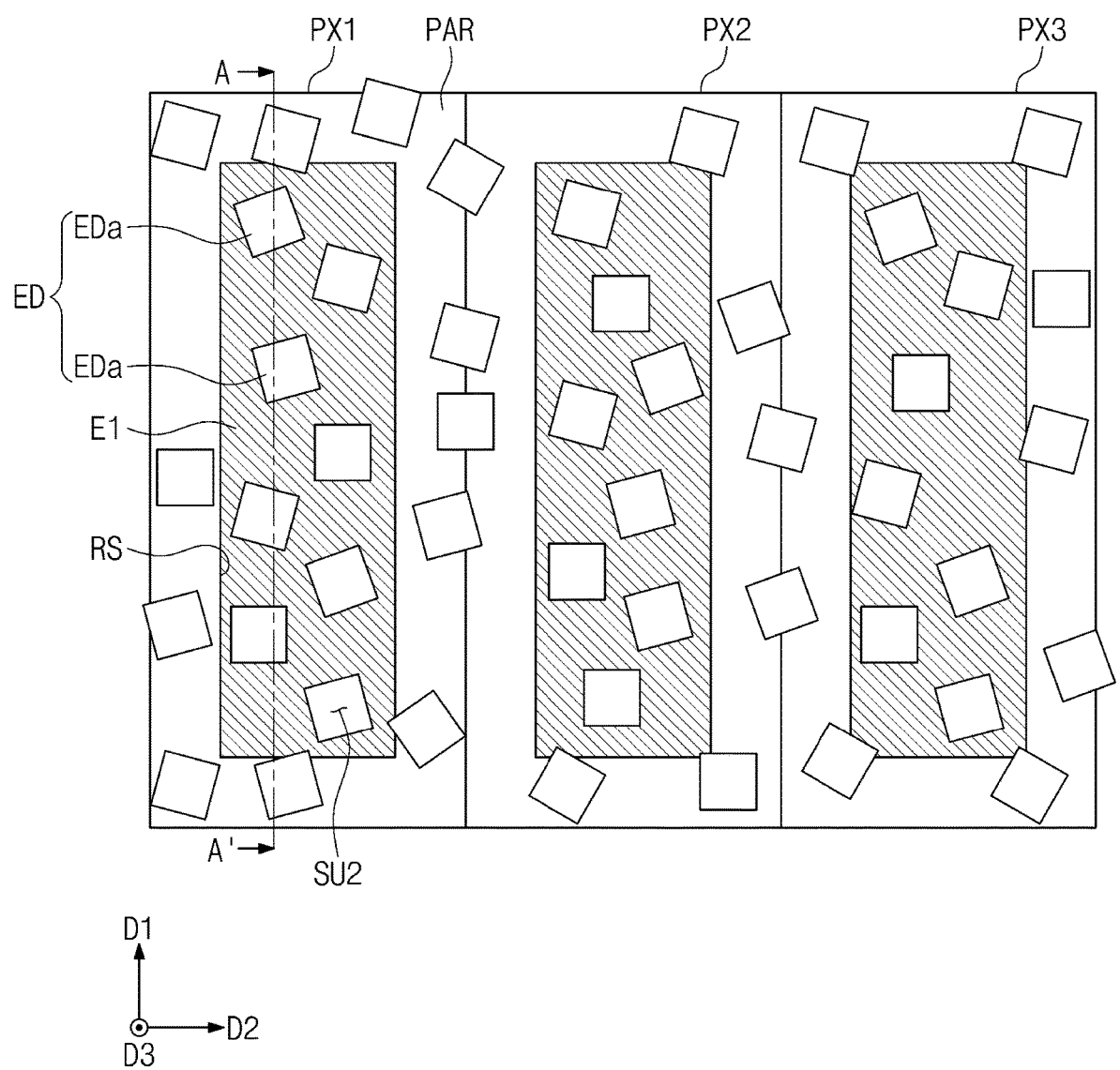
FIG. 27 is a plan-view for explaining a method for manufacturing the display device in FIGS. 25 and 26.
Figure 28:
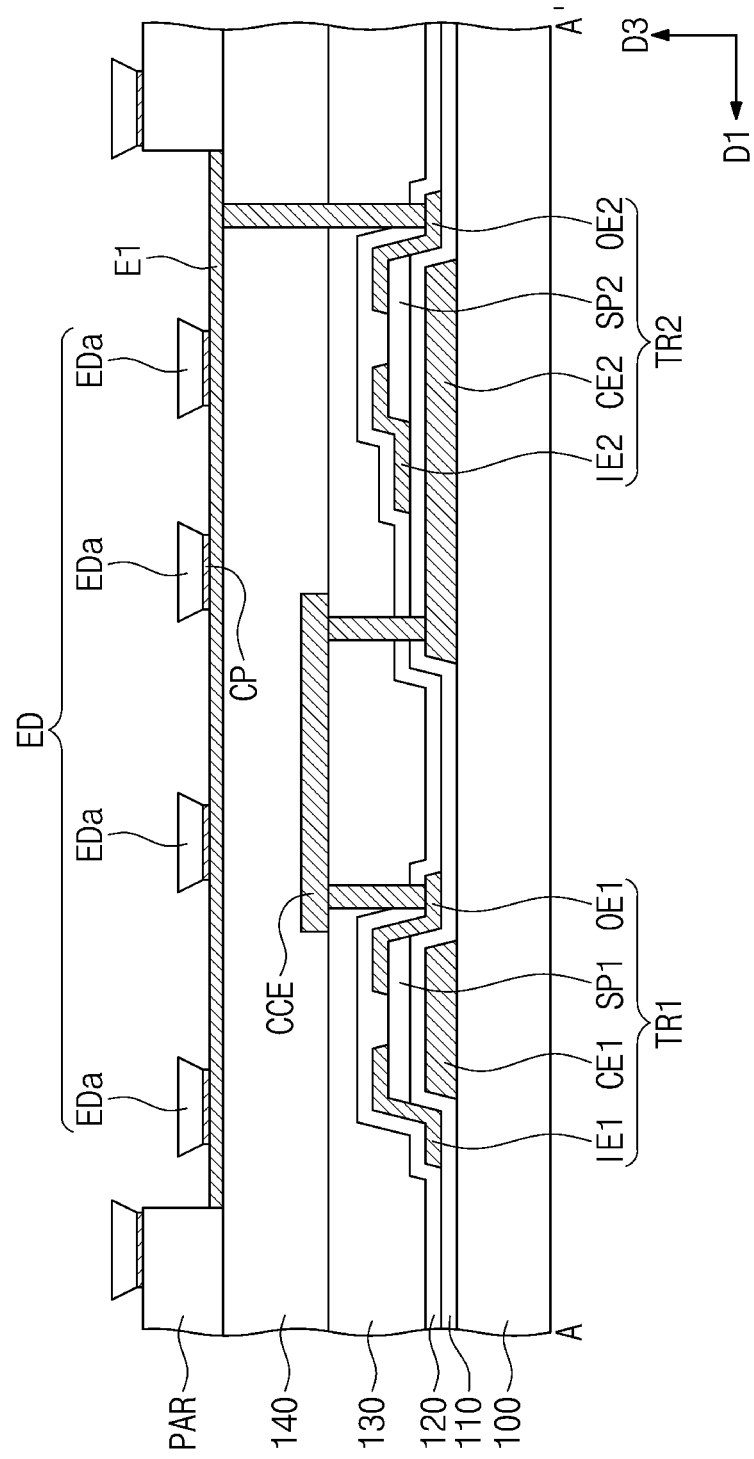
FIG. 28 is a cross-section view taken along line A-A' of FIG. 27.

FIG. 27 is a plan-view for explaining a method for manufacturing the display device in FIGS. 25 and 26. FIG. 28 is a cross-section view taken along line A-A' of FIG. 27. In the embodiment, detailed description on the technical features overlapped with the manufacturing method described with reference to FIGS. 10 to 18 will be omitted, and different points will be described in detail.

Referring to FIGS. 27 and 28, the light-emitting elements ED may be provided on the device shown in FIGS. 12 and 13. Each of the light-emitting elements ED may be disposed so that the first surface SU1 thereof faces the base layer 100. In other words, the light-emitting elements ED may be randomly arranged on the base layer 100 in a two-dimensional manner. However, the first surfaces SU1 of the light-emitting elements ED may be aligned so that all of the first surfaces SU1 face the base layer 100. Thereafter, the heat treatment may be performed on the base layer 100 again. The second electrode E2 and the color filter CF may be formed on the light emitting elements ED.

The display device according to the embodiment of the inventive concept may be quickly and economically manufactured by randomly arranging the light emitting elements on the pixel. Particularly, the method for manufacturing the display device may simply realize the large-area display device.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A display device comprising:
a plurality of pixels on a base layer; and
a first light-emitting element and a second light-emitting element, which are provided on a first pixel of the pixels,
a first electrode between the first and second light-emitting elements and the base layer; and
a second electrode on the first and second light-emitting elements,
wherein each of the first and second light-emitting elements comprises a first surface and a second surface opposite to the first surface,
wherein the first surface of the first light-emitting element faces the base layer,
wherein the second surface of the second light-emitting element faces the base layer,
wherein the first surface of the first light-emitting element faces the first electrode, and the second surface of the first light-emitting element faces the second electrode, and
wherein the first surface of the second light-emitting element faces the second electrode, and the second surface of the second light-emitting element faces the first electrode.

2. The display device of claim 1, wherein each of the first and second light-emitting elements comprises a first semiconductor layer, an active layer, and a second semiconductor layer, which are sequentially stacked,
the first semiconductor layer is adjacent to the first surface, and
the second semiconductor layer is adjacent to the second surface.

3. The display device of claim 1, wherein the first light-emitting element is an active light-emitting element, and the second light-emitting element is a dummy light-emitting element.

4. The display device of claim 1, wherein, when viewed in plan-view:

a first center line passing a center of the first light-emitting element and perpendicular to both sidewalls of the first light-emitting element is defined,
a second center line passing a center of the second light-emitting element and perpendicular to both sidewalls of the second light-emitting element is defined, and
the first center line and the second center line cross each other.

5. The display device of claim 1, further comprising conductive patterns on the first surfaces of the first and second light-emitting elements, respectively.

6. The display device of claim 1, wherein each of the first and second light-emitting elements has a ratio of a maximum width to a height in a range from about 2 to about 50.

7. The display device of claim 1, wherein the second surface has an area greater than that of the first surface.

8. A display device comprising:
a plurality of pixels on a base layer; and
a plurality of light-emitting elements provided on a first pixel of the pixels,
wherein the plurality of light-emitting elements comprise a first light-emitting element, a second light-emitting element, a third light-emitting element, and fourth light-emitting element,
the second, third and fourth light-emitting elements are adjacent to the first light-emitting element,
wherein, when viewed in plan-view:
a first virtual line configured to connect a center of the first light-emitting element and a center of the second light-emitting element is defined,
a second virtual line configured to connect the center of the first light-emitting element and a center of the third light-emitting element is defined,
a third virtual line configured to connect the center of the first light-emitting element and a center of the fourth light-emitting element is defined,
the first to third virtual lines have different lengths from each other, and
an angle between the first virtual line and the second virtual line is different from that between the second virtual line and the third virtual line.

9. The display device of claim 8, wherein the light-emitting elements are randomly arranged on the first pixel in a two-dimensional manner.

10. The display device of claim 8, wherein each of the light-emitting elements comprises a first surface and a second surface opposite to the first surface,
the first surface of the first light-emitting element faces the base layer, and
the second surface of the second light-emitting element faces the base layer.

11. The display device of claim 10, wherein each of the light-emitting elements comprises a first semiconductor layer, an active layer, and a second semiconductor layer, which are sequentially stacked,
the first semiconductor layer is adjacent to the first surface, and
the second semiconductor layer is adjacent to the second surface.

12. The display device of claim 8, wherein each of the light-emitting elements has a ratio of a maximum width to a height in a range from about 2 to about 50.

13. The display device of claim 8, further comprising:
a first electrode on the first pixel; and
a second electrode spaced vertically apart from the first electrode, wherein the light-emitting elements are disposed between the first electrode and the second electrode.

14. A display device comprising:
a plurality of pixels arranged in a first direction on a base layer; and
first and second light-emitting elements provided on a first pixel of the pixels,
wherein, when viewed in plan-view:
a first center line passing a center of the first light-emitting element and perpendicular to both sidewalls of the first light-emitting element is defined,
a second center line passing a center of the second light-emitting element and perpendicular to both sidewalls of the second light-emitting element is defined,
the first center line and the first direction have a first angle, and
the second center line and the first direction have a second angle different from the first angle.

15. The display device of claim 14, further comprising a third light-emitting element provided on the first pixel,
wherein, when viewed in plan-view:
a third center line passing a center of the third light-emitting element and perpendicular to both sidewalls of the third light-emitting element is defined,
the third center line and the first direction have a third angle, and
the third angle is different from each of the first angle and the second angle.

16. The display device of claim 14, wherein each of the first and second light-emitting elements comprises a first surface and a second surface opposite to the first surface,
the first surface of the first light-emitting element faces the base layer, and
the second surface of the second light-emitting element faces the base layer.

17. The display device of claim 16, wherein each of the first and second light-emitting elements comprises a first semiconductor layer, an active layer, and a second semiconductor layer, which are sequentially stacked,
the first semiconductor layer is adjacent to the first surface, and
the second semiconductor layer is adjacent to the second surface.

18. The display device of claim 14, wherein each of the first and second light-emitting elements has a ratio of a maximum width to a height in a range from about 2 to about 50.

19. The display device of claim 14, further comprising:
a first electrode on the first pixel; and
a second electrode spaced vertically apart from the first pixel,
wherein the first and second light-emitting elements are disposed between the first electrode and the second electrode.

* * * * *